(12) United States Patent
Liaw

(10) Patent No.: US 10,879,174 B2
(45) Date of Patent: Dec. 29, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsnichu (TW)

( * ) Notice: Subject to any disclaimer, the term of this patent is extended or adjusted under 35 U.S.C. 154(b) by 0 days.

(21) Appl. No.: 15/921,368

(22) Filed: Mar. 14, 2018

(65) Prior Publication Data
US 2019/0287902 A1 Sep. 19, 2019

(51) Int. Cl.
H01L 23/52 (2006.01)
H01L 21/76 (2006.01)
H01L 27/08 (2006.01)
H01L 29/66 (2006.01)
H01L 29/78 (2006.01)
H01L 23/528 (2006.01)
H01L 23/532 (2006.01)
H01L 23/535 (2006.01)
H01L 21/768 (2006.01)
H01L 27/088 (2006.01)
H01L 27/11 (2006.01)
H01L 21/8234 (2006.01)
H01L 29/417 (2006.01)

(52) U.S. Cl.
CPC .... *H01L 23/5283* (2013.01); *H01L 21/76816* (2013.01); *H01L 21/76831* (2013.01); *H01L 21/76895* (2013.01); *H01L 23/535* (2013.01); *H01L 23/5329* (2013.01); *H01L 27/0886* (2013.01); *H01L 29/66795* (2013.01); *H01L 29/785* (2013.01); *H01L 29/7848* (2013.01); *H01L 29/7851* (2013.01); *H01L 21/823431* (2013.01); *H01L 27/1104* (2013.01); *H01L 29/41791* (2013.01)

(58) Field of Classification Search
CPC .... H01L 23/52; H01L 23/528; H01L 23/5283
USPC ........................................................ 257/401
See application file for complete search history.

(56) References Cited

U.S. PATENT DOCUMENTS

| | | | | |
|---|---|---|---|---|
| 6,900,124 B1 * | 5/2005 | Kim | ................. | H01L 21/76802 257/316 |
| 7,018,922 B1 * | 3/2006 | Kim | ................. | H01L 21/76802 257/316 |
| 8,871,593 B1 * | 10/2014 | Siemieniec | ....... | H01L 29/66734 438/272 |
| 9,041,115 B2 | 5/2015 | Liaw | | |
| 9,041,117 B2 | 5/2015 | Liaw | | |
| 9,614,047 B2 * | 4/2017 | Horak | ............... | H01L 21/28008 |

(Continued)

*Primary Examiner* — Fazli Erdem
(74) *Attorney, Agent, or Firm* — Maschoff Brennan

(57) ABSTRACT

A semiconductor device includes a substrate, a semiconductor fin, first and second source/drains, a gate electrode, and a gate contact. The semiconductor fin is disposed on the substrate. The first and second source/drains is disposed on the semiconductor fin. The gate electrode is across the semiconductor fin and exposes the first and second source/drains. The gate contact is disposed on the gate electrode and has an elliptical profile with a major axis extending along a lengthwise direction of the gate electrode when viewed from above the gate contact.

20 Claims, 11 Drawing Sheets

(56) References Cited

U.S. PATENT DOCUMENTS

| | | | | |
|---|---|---|---|---|
| 2004/0058495 | A1* | 3/2004 | Yoon | H01L 27/115 |
| | | | | 438/257 |
| 2010/0013105 | A1* | 1/2010 | Lin | G03F 1/36 |
| | | | | 257/774 |
| 2010/0117062 | A1* | 5/2010 | Hudait | H01L 29/205 |
| | | | | 257/24 |
| 2010/0202208 | A1* | 8/2010 | Endo | G11C 16/0466 |
| | | | | 365/185.18 |
| 2012/0001271 | A1* | 1/2012 | Chae | H01L 29/4238 |
| | | | | 257/401 |
| 2012/0132970 | A1* | 5/2012 | Park | H01L 21/76804 |
| | | | | 257/296 |
| 2013/0082331 | A1* | 4/2013 | Fukuda | H01L 29/7833 |
| | | | | 257/368 |
| 2013/0258759 | A1* | 10/2013 | Liaw | G11C 11/412 |
| | | | | 365/154 |
| 2014/0035056 | A1* | 2/2014 | Liaw | G11C 11/412 |
| | | | | 257/369 |
| 2015/0004723 | A1* | 1/2015 | Fan | H01L 22/14 |
| | | | | 438/17 |
| 2015/0263023 | A1* | 9/2015 | Toba | H01L 29/40114 |
| | | | | 257/314 |
| 2016/0359008 | A1* | 12/2016 | Choi | H01L 29/41791 |
| 2018/0033866 | A1* | 2/2018 | Liao | H01L 21/28123 |
| 2018/0211875 | A1* | 7/2018 | Basker | H01L 21/76897 |
| 2018/0277430 | A1* | 9/2018 | Xie | H01L 21/76879 |
| 2018/0301559 | A1* | 10/2018 | Liaw | H01L 29/7851 |
| 2019/0259619 | A1* | 8/2019 | Zang | H01L 29/7851 |

* cited by examiner

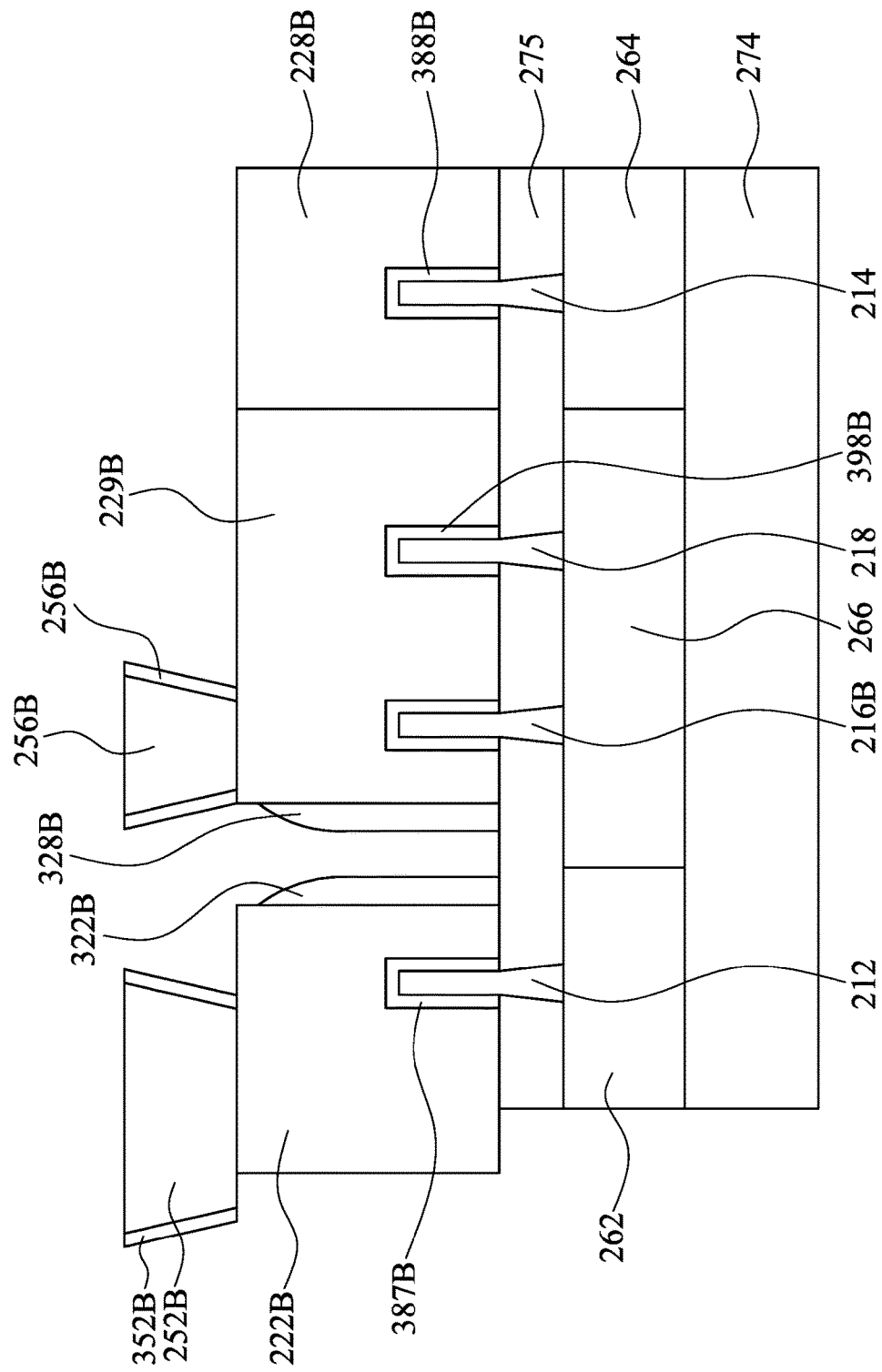

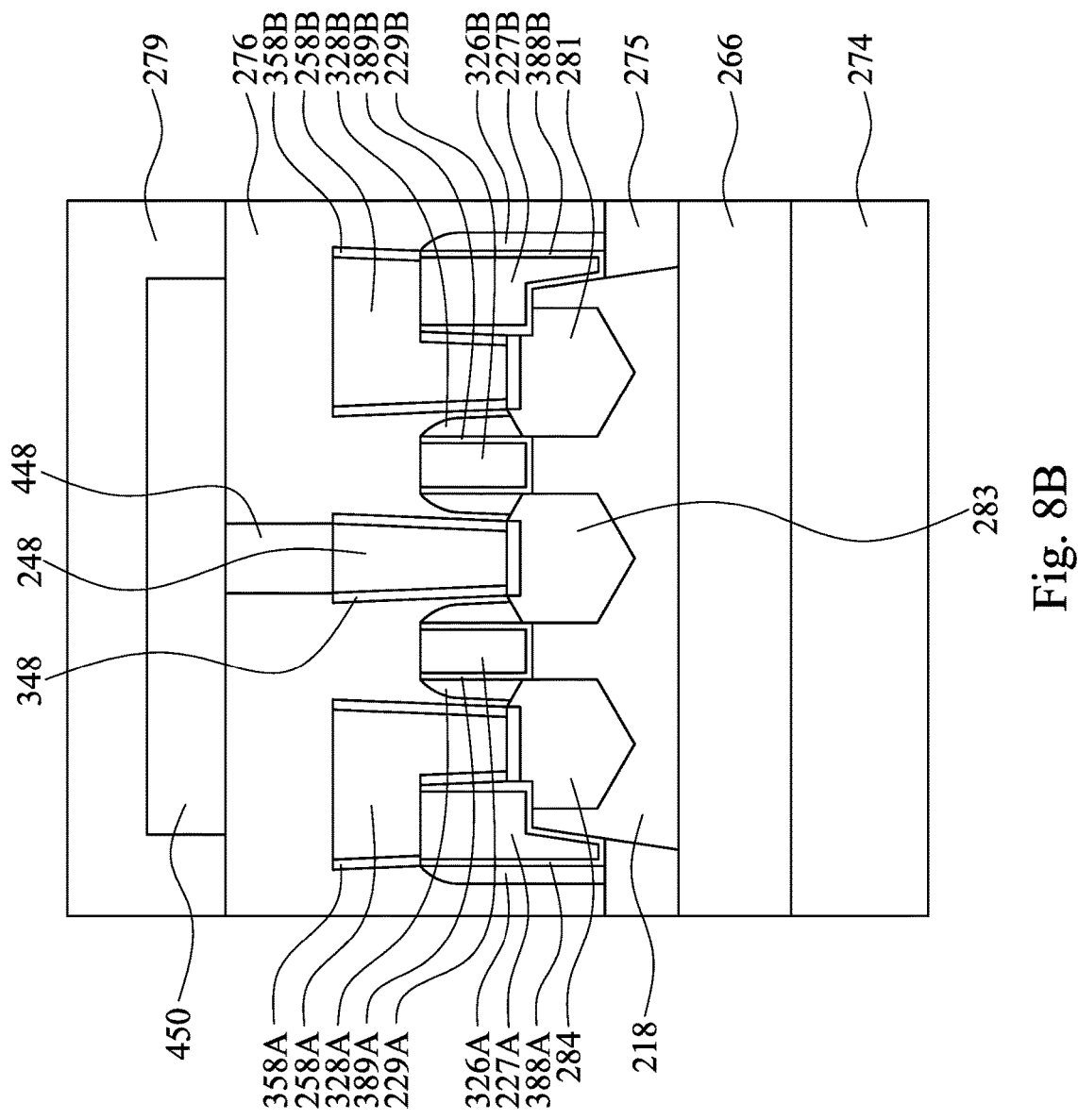

SEMICONDUCTOR DEVICE AND MANUFACTURING METHOD THEREOF

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. In some applications in an IC chip, a plurality of SRAM devices are implemented based on different design criteria. For example, at least one SRAM device of the plurality of SRAM devices is designed to have faster data access than all other SRAM device(s) of the plurality of SRAM devices; and at least one SRAM device of the plurality of SRAM devices is designed to occupy less area per stored bit than all other SRAM device(s) of the plurality of SRAM devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A and 8B illustrate cross-sectional views along line A'-A' and line B'-B' in FIG. 6 respectively.

DETAILED DESCRIPTION

Figure 1:
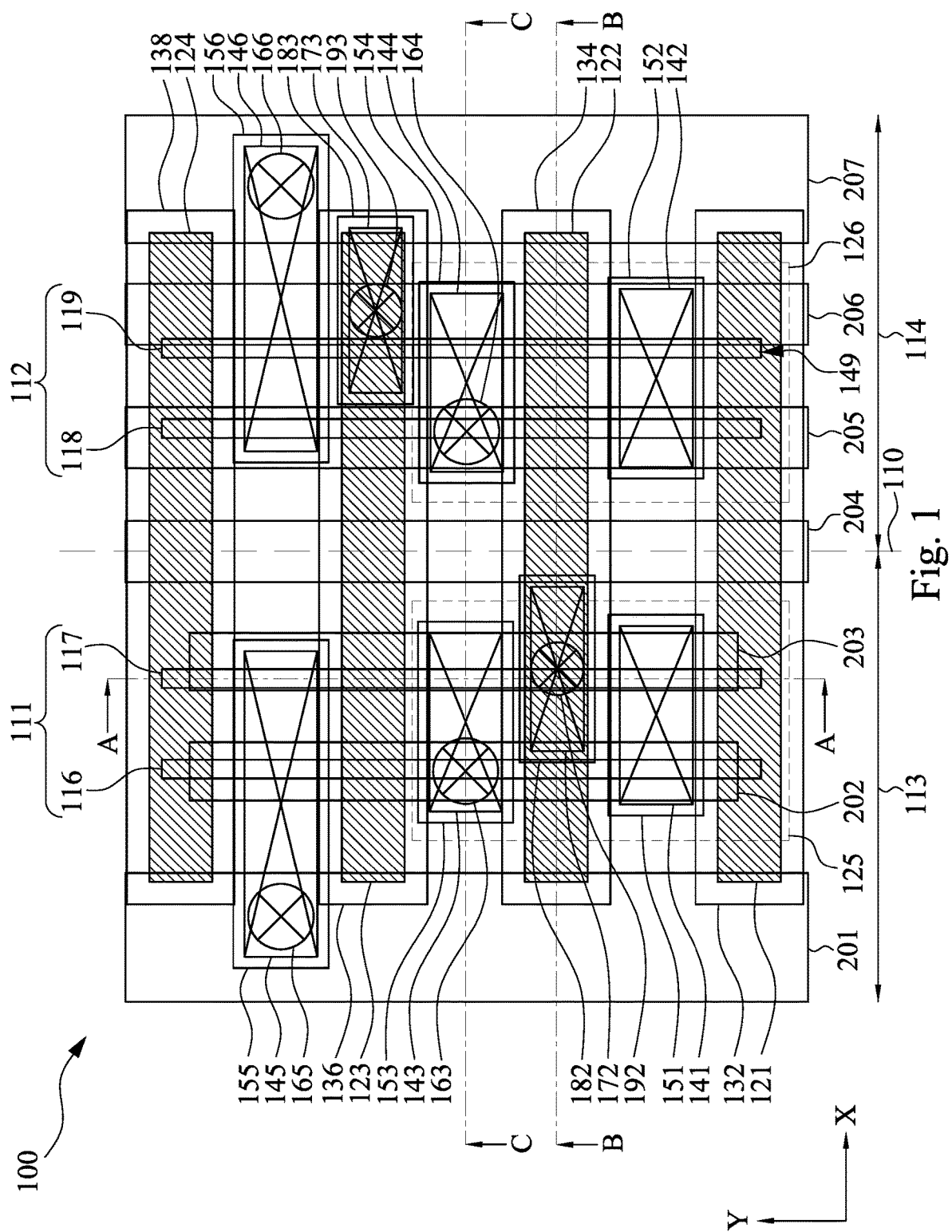
FIG. 1 illustrates a layout of a semiconductor device having a plurality of Fin Field-effect Transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 3A:
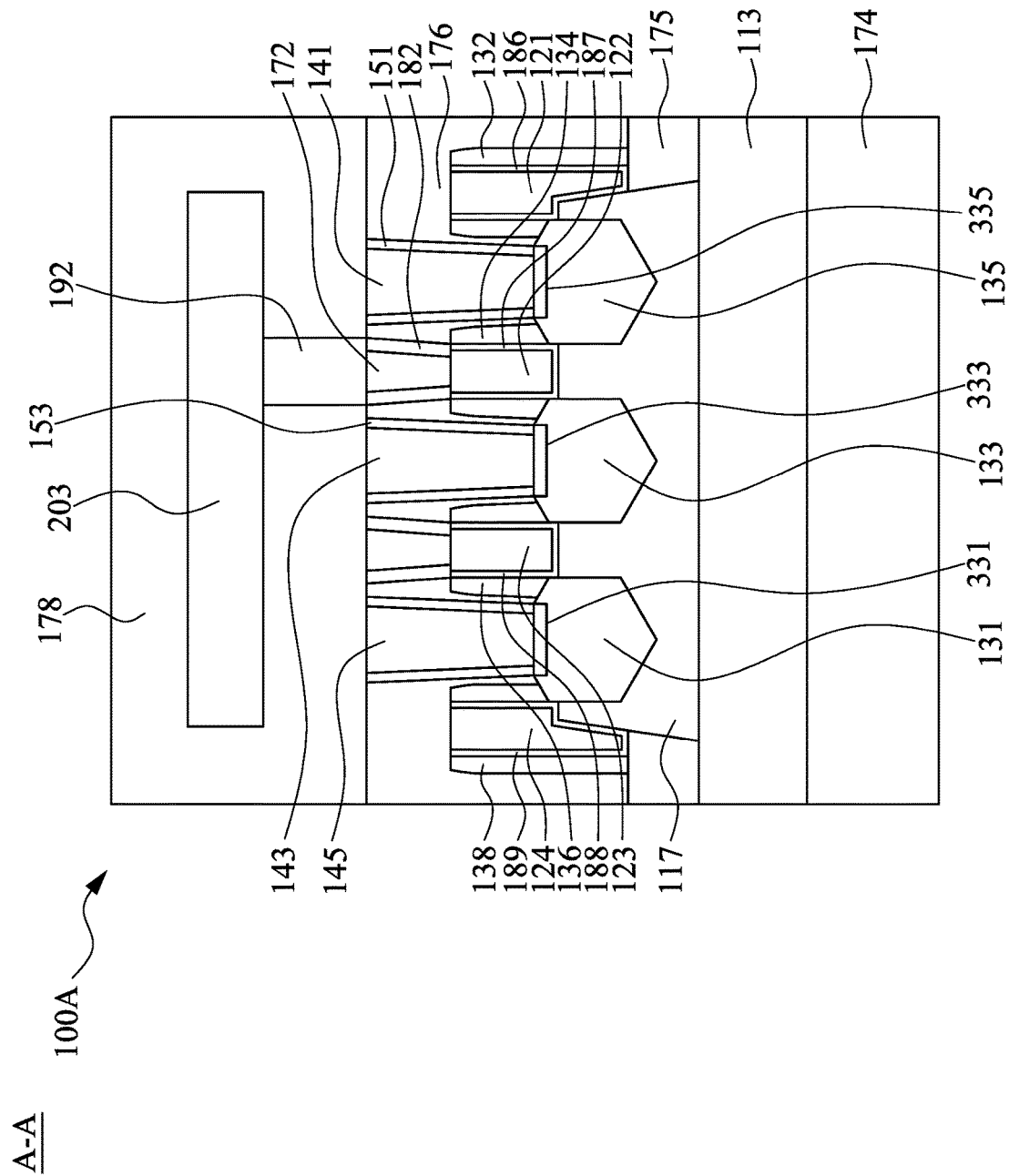
FIGS. 3A, 3B, and 3C illustrate cross-sectional views along line A-A, line B-B, and line C-C in FIG. 1 respectively.
Figure 3B:
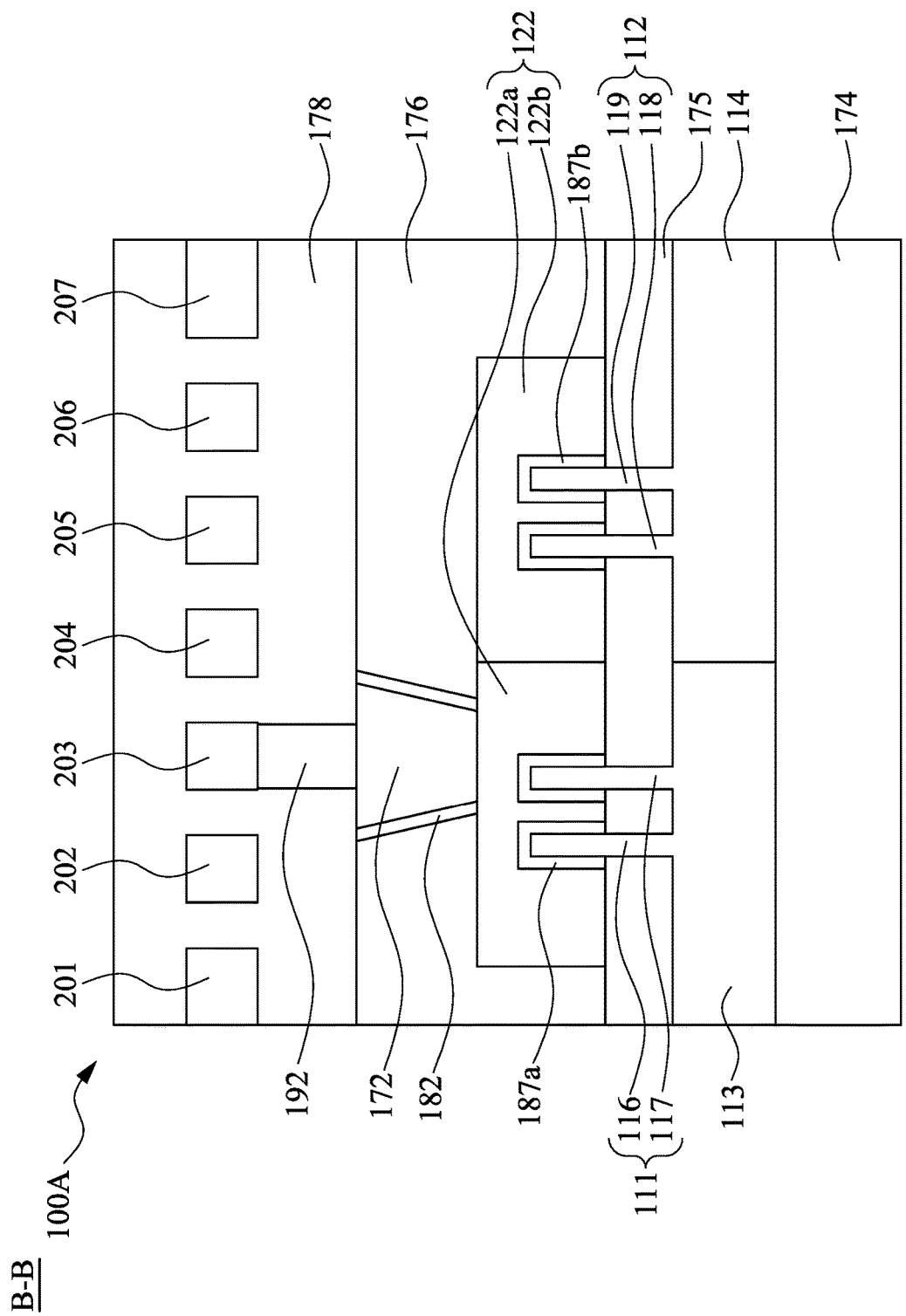
Figure 3C:
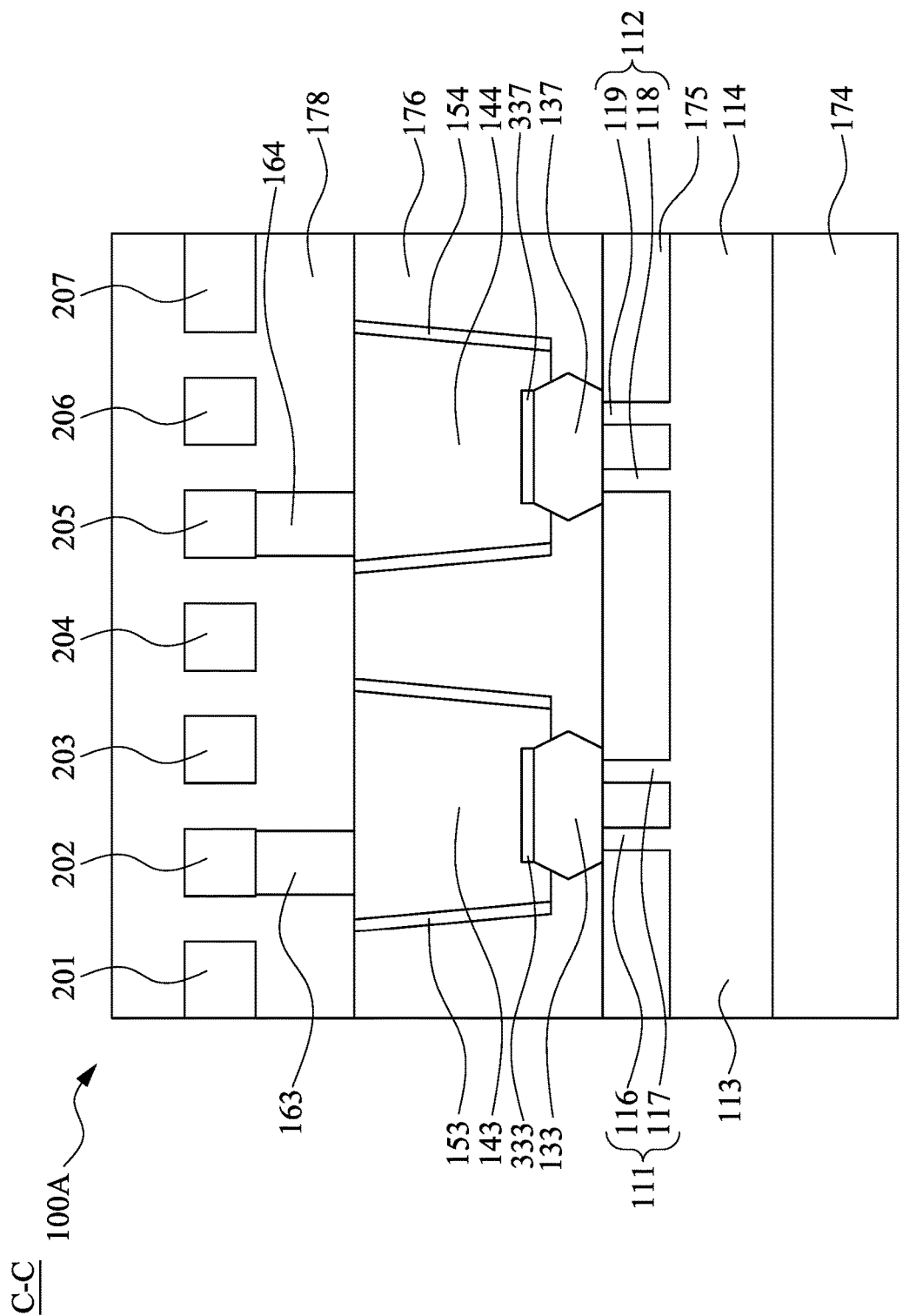

FIG. 1 illustrates a layout of a semiconductor device 100A shown in FIGS. 3A, 3B, and 3C having a plurality of Fin Field-effect Transistors (FinFETs) in accordance with some embodiments. A layout 100 includes a plurality of well regions 113 and 114, a plurality of active area regions 111 and 112, a plurality of gate electrodes 121, 122, 123, and 124, a plurality of gate spacers 132, 134, 136, and 138, a plurality of gate contact 172 and 173, a plurality of gate contact barrier layers 182 and 183, a plurality of gate vias 191 and 192, a plurality of S/D contacts 141, 142, 143, 144, 145, and 146, a plurality of S/D contact barrier layers 151, 152, 153, 154, 155, and 156, a plurality of S/D vias 163, 164, 165, and 166, and a plurality of conductive lines 201, 202, 203, 204, 205, 206, and 207.

As shown in FIG. 1, the n-well region 113 and the p-well region 114 are on opposite side of an imaginary line 110 which divides the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In the example configuration in FIG. 1, the n-well region 113 is a region for forming p-channel metal-oxide semiconductor (PMOS) transistors, and the p-well region 114 is a region for forming n-channel metal-oxide semiconductor (NMOS) transistors. The described conductivity of the well regions 113 and 114 herein is an example. Other arrangements are within the scope of various embodiments.

The active area regions 111 and 112 extend along a first direction of the layout 100, e.g., the Y direction. In some embodiments, the active area regions 111 and 112 are also referred to as oxide-definition (OD) regions. Example materials of the active area regions 111 and 112 include, but are not limited to, semiconductor materials doped with various types of p-dopants and/or n-dopants. In some embodiments, the active area regions 111 and 112 include dopants of the same type. In some embodiments, one of the active area regions 111 and 112 includes dopants of a type different from a type of dopants of another one of the active area regions 111 and 112. The active area regions 111 and 112 are isolated from each other by one or more isolation structures as described herein. The active area regions 111 and 112 are within corresponding well regions. For example, the active area region 111 is within a well region 113 which is an n-well region in some embodiments, and the active area region 112 is within a well region 114 which is a p-well region in some embodiments.

Each of the active area regions 111 and 112 includes one or more semiconductor fins to form FinFETs. For example, the active area region 111 includes two semiconductor fins 116 and 117, and the active area region 112 includes two semiconductor fins 118 and 119. The semiconductor fins 116, 117, 118, and 119 are isolated from each other by one or more isolation structures as described herein. Other numbers of fins in each of the active area regions 111 and 112 are within the scope of various embodiments. The described FinFET configuration is an example. Other arrangements are within the scope of various embodiments. For example, in some embodiments, the active area regions 111 and 112 do not include fins and are configured for forming planar MOSFET transistors.

The gate electrodes 121, 122, 123, and 124 extend along a second direction of the layout 100, e.g., the X direction, across the active area regions 111 and 112. Example materials of the gate electrodes 121, 122, 123, and 124 include, but are not limited to, polysilicon and metal. Other materials are within the scope of various embodiments. The gate electrodes 121, 122, 123, and 124 and the corresponding active area regions 111 and 112 form one or more transistors in the layout 100. For example, in the example configuration in FIG. 1, a transistor 125 is formed by the gate electrode 122 and the active area region 111. One of a drain or a source (referred to herein as "source/drain") of the transistor 125 is defined by a region of the active area region 111 on one side (e.g., the upper side in FIG. 1) of the gate electrode 122. The other source/drain of the transistor 125 is defined by another region of the active area region 111 on the opposite side (e.g., the lower side in FIG. 1) of the gate electrode 122. For another example, a further transistor 126 is formed by the gate electrode 122 and the active area region 112. In some embodiments, further transistors are formed by the gate electrode 123 and the corresponding active area regions 111 and 112. One or more of the gate electrodes 121, 122, 123, and 124 are coupled to other circuitry of the semiconductor device by corresponding gate contacts. For example, gate contacts 172 and 173 are configured on the corresponding gate electrodes 122 and 123 for coupling the corresponding gate electrodes 122 and 123 to other circuitry. The active area regions 111 and 112 terminate in the gate electrodes 121. For example, the fin 119 terminates at a lower end 149 thereof in the gate electrodes 121. Similarly, the active area regions 111 and 112 terminate in the gate electrodes 124. In the example configuration in FIG. 1, the ends of the fins 116, 117, 118, and 119 are under the gate electrodes 121.

The gate spacers 132, 134, 136, and 138 are at least arranged along sides of the corresponding plurality of gate electrodes 121, 122, 123, and 124. For example, the gate spacers 132 are arranged along longitudinal sides of the gate electrode 121 in the X direction, the gate spacer 134 are arranged along longitudinal sides of the gate electrode 122, the gate spacer 136 is arranged along longitudinal sides of the gate electrode 123, and the gate spacer 138 is arranged along longitudinal sides of the gate electrode 124. The gate spacers 132, 134, 136, and 138 include one or more dielectric materials for electrically isolating the corresponding gate electrodes from unintended electrical contact. Example dielectric materials of the gate spacers 132, 134, 136, and 138 include, but are not limited to, silicon nitride, oxynitride and silicon carbide. In some embodiments, one or more of the gate spacers 132, 134, 136, and 138 have a tapered profile as described herein.

The gate contacts 172 and 173 overlap the corresponding active area regions 111 and 112. For example, the gate contact 172 overlaps the fins 116 and 117 and the gate contact 173 overlaps the fins 118 and 119. In other words, the gate contact 172 has a vertical projection projected on the fins 116 and 117 where are acted as a channel region and the gate contact 173 has a vertical projection projected on the fins 118 and 119 where are acted as a channel region. The gate contacts 172 and 173 are configured to electrically couple the underlying gate electrodes 122 and 123 of the corresponding transistors with each other or with other circuitry of the semiconductor device. The gate contact 172 is between the S/D contacts 141 and 143. The gate contact 173 is between the S/D contacts 144 and 146. In some embodiments, the gate contacts 172 and 173 are in a slot shape and may be also refer to as in a line shape. Example materials of the gate contacts 172 and 173 include Ti, TiN, TaN, Co, Ru, Pt, W, Al, Cu, or any combinations thereof.

In the example configuration in FIG. 1, boundaries of one or more of the gate contact 172 and 173 are surrounded by the gate contact barrier layers 182 and 183 respectively. In some embodiments, a thickness of at least one of the gate contact barrier layers 182 and 183 is in a range from about 5 Å to about 50 Å. Example materials of the gate contact barrier layers 182 and 183 include high-K dielectric, such as nitride-base high-K dielectric or metal oxide high-K dielectric. In some embodiments, the gate contact barrier layers 182 and 183 are made of $Si_3N_4$. In some embodiments, the gate contact barrier layers 182 and 183 include Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or any combinations thereof. In some embodiments, the gate contact 172 and 173 has a dielectric constant larger than 4.9.

The gate vias 192 and 193 overlap the gate contacts 172 and 173 respectively. The gate via 192 is between the S/D vias 163 and 164 and is connected to the conductive line 203. In addition, the gate via 192 overlaps the semiconductor fin 117 and has a vertical projection projected on the semiconductor fin 117. The gate via 193 is between the S/D vias 164 and 166 and is connected to the conductive line 206. The gate via 193 and the S/D vias 164 and 166 are arranged in an altering manner in sequence. The gate vias 192 and 193 are in a circle shape. For example, the length ratio of longer side to short side of at least one of the gate vias 192 and 193 is less than 1.2.

The S/D contacts 141, 142, 143, 144, 145, and 146 overlap the corresponding active area regions 111 and 112. For example, the S/D contacts 141, 143, and 145 overlap the active area region 111, and the contacts 142, 144, and 146 overlap the active area region 112. The S/D contacts 141, 152, 153, 154, 145, and 146 are configured to electrically couple the underlying source/drains of the corresponding transistors with each other or with other circuitry of the semiconductor device. Example materials of the S/D contacts 141, 142, 143, 144, 145, and 146 include Ti, TiN, TaN, Co, Ru, Pt, W, Al, Cu, or any combinations thereof. In some embodiments, the S/D contacts 141, 142, 143, 144, 145, and 146 are in a slot shape and may be also refer to as in a line shape. For example, the length ratio of longer side to short side of at least one of the S/D contact 141, 142, 143, 144, 145, and 146 is larger than 2. In some embodiments, the S/D contacts 141, 142, 143, 144, 145, and 146 are made of a material that is the same as the gate contacts 172 and 173. Alternatively, in some embodiments, the S/D contacts 141, 142, 143, 144, 145, and 146 are made of a material that is different from the gate contacts 172 and 173.

In the example configuration in FIG. 1, boundaries of one or more of the S/D contacts 141, 142, 143, 144, 145, and 146 are surrounded by the S/D contact barrier layers 151, 152, 153, 154, 155, and 156 respectively and are spaced from boundaries of the gate spacers 132, 134, 136, and 138. For example, an upper edge of the S/D contact 145 is spaced in the Y direction from an adjacent lower edge of the spacer 138 by the S/D contact barrier layer 155, and a lower edge of the contact area 145 is spaced in the Y direction from an adjacent upper edge of the gate spacer 136 by the S/D contact barrier layer 155. In some embodiments, a thickness of at least one of the S/D contacts 141, 142, 143, 144, 145, and 146 is in a range from about 5 Å to about 50 Å. Example materials of the S/D contact barrier layers 151, 152, 153, 154, 155, and 156 include high-K dielectric, such as nitride-base high-K dielectric or metal oxide high-K dielectric. In some embodiments, the S/D contact barrier layers 151, 152, 153, 154, 155, and 156 are made of Si3N4. In some embodiments, the S/D contact barrier layers 151, 152, 153, 154, 155, and 156 include Hf oxide (HfO$_2$), Ta oxide (Ta$_2$O$_5$), Ti oxide (TiO$_2$), Zr oxide (ZrO$_2$), Al oxide (Al$_2$O$_3$), Y oxide (Y$_2$O$_3$), or any combinations thereof. In some embodiments, the S/D contact barrier layers 151, 152, 153, 154, 155, and 156 are made of a material that is the same as the gate contact barrier layers 182 and 183. Alternatively, in some embodiments, the S/D contact barrier layers 151, 152, 153, 154, 155, and 156 are made of a material that is different from the gate contact barrier layers 182 and 183.

In some embodiments, the S/D vias 163, 164, 165, and 166 overlap and are in contact with the S/D contacts 143, 144, 145, and 146 respectively and are connected to the conductive line 201, 202, 205, and 207 respectively. The S/D vias 163, 164, 165, and 166 are in a circle shape. For example, the length ratio of longer side to short side of at least one of the S/D vias 163, 164, 165, and 166 is less than 1.2. One of the S/D vias 163, 164, 165, and 166 has a top surface with an area which is larger than that of one of the gate vias 191 and 192. In other words, one of the S/D vias 163, 164, 165, and 166 has a first vertical projection projected on the substrate, one of the gate vias 191 and 192 has a second vertical projection projected on the substrate, and a first area of the first vertical projection is larger than a second area of the second vertical projection. In some embodiments, the first area of the first vertical projection is larger than the second area of the second vertical projection about 20%.

In some embodiments, the layout 100 is represented by a plurality of masks generated by one or more processors and/or stored in one or more non-transitory computer-readable media. Other formats for representing the layout 100 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout 100 is presented by at least one first mask corresponding to the active area regions 111 and 112, at least one second mask corresponding to the gate electrodes 121, 122, 123, and 124, and at least one third mask corresponding to the gate spacers 132, 134, 136, and 138.

The conductive lines 201, 202, 203, 204, 205, 206, and 207 extend along the Y direction of the layout 100. In some embodiments, the conductive lines 201, 202, 203, 204, 205, 206, and 207 are in a first interconnection layer of the layout 100, such as a first metal layer. The conductive lines 201, 202, 205, and 207 overlap and are electrically connected to the S/D contacts 145, 143, 144, and 146 through the S/D vias 165, 163, 164, and 166 respectively. The conductive line 203 is electrically connected to the gate contact 172 through the gate via 192, overlaps the semiconductor fin 117, and is between adjacent two of the conductive lines 202 and 204 which are without passing through the gate vias 192. The conductive line 206 is electrically connected to the gate contact 173 through the gate via 193, overlaps the semiconductor fin 119, and is between adjacent two of the conductive lines 205 and 207 overlapping the S/D vias 164 and 166.

Due to the formation of the gate contacts 172 and 173, the gate contact 172 and 173 may be disposed above the channel region and between the S/D contact, such that the conductive line 203 connected to the gate contact 172 can pass through the channel region and between the conductive line 202 connected to the S/D contact 163 and the conductive line 204, and such that the conductive line 206 connected to the gate contact 173 can pass through the channel region and between the conductive lines 205 and 207 connected to the S/D contacts 164 and 166. Hence, it allows designer has more choices to dispose the gate contacts on sites, such as STI region and channel region of the semiconductor device, and thus the conductive lines can be design more freedom without layout constraint and the circuit density can be improved.

Furthermore, the gate and S/D contacts in line shape can help on lithography patterning and improve a critical dimension (CD) thereof. The gate contact barrier layers with high-K dielectric surrounding the gate contacts improve the isolation margin between the gate contacts and the adjacent S/D contacts. Similarly, the S/D contact barrier layers with high-K dielectric surrounding the S/D contacts improve the isolation margin between the S/D contacts and the adjacent gate contacts.

Figure 2B:
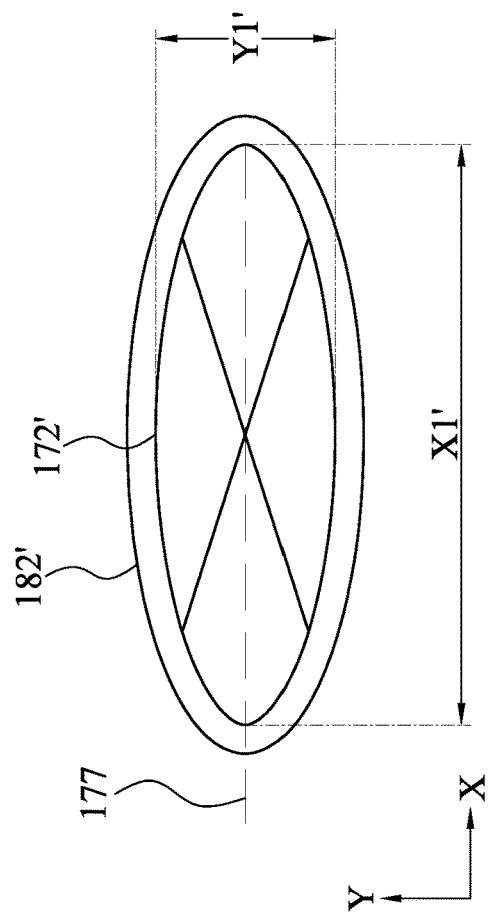
FIGS. 2A and 2B are top views of a shape of a gate contact in a layout and a final shape of the gate contact in a dielectric layer of a semiconductor device respectively in accordance with some embodiments.
Figure 2A:
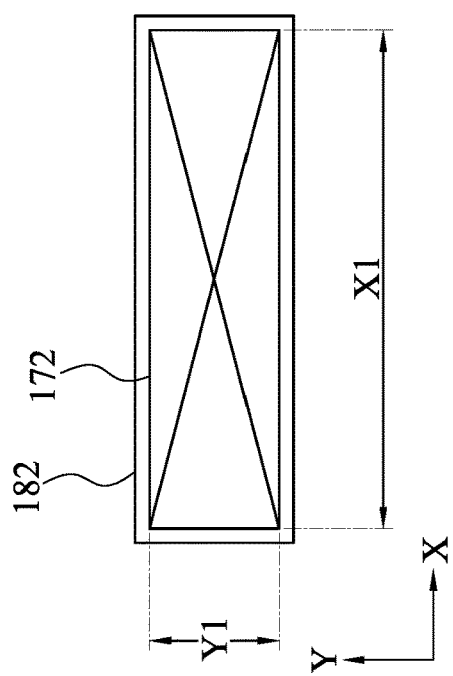

FIG. 2A is a top view of the gate contact 172 in the layout 100, and FIG. 2B is a top view of the physical gate contact 172' of a semiconductor device fabricated using the layout 100. The details regarding the components in FIGS. 2A and 2B may thus be found in the discussion of the embodiment shown in FIG. 1. In FIGS. 2A and 2B, a gate contact 172' is formed in a dielectric layer 176 (shown in FIGS. 3A and 3B) based on the shape of the gate contact 172 in the layout 100. The gate contact 172' defines a longitudinal length X1' extended in a direction parallel to the X direction and defines a transversal length Y1' extended in a direction parallel to the Y direction, in which the longitudinal length X1' runs in the direction of a long axis of the gate contact 172', the transversal length Y1' runs in the direction of a short axis of the gate contact 172', and the longitudinal length X1' is substantially orthogonal to the transversal length Y1'. In some embodiments, the shape of the gate contact 172' is in a shape of an ellipse. In some embodiments, the longitudinal length X1' is parallel to a longitudinal direction of at least one of the gate electrodes 121, 122, 123, and/or 124.

In some embodiments, as shown in FIGS. 1, 2A, and 2B, the gate contact 172' is disposed on the gate electrode 122 and has an elliptical profile extending along a direction parallel to a lengthwise direction of the gate electrodes 122 and/or 123 when viewed from above the gate contact 172'. That is, the elliptical profile has a major axis 177 as shown in FIG. 2B extending along a lengthwise direction of the gate electrode 122 and/123 when viewed from above the gate contact 172' and 173'. In other words, a length of the gate contact 172' along the lengthwise direction of the gate electrodes 122 and/or 123 is larger than that along a lengthwise direction of the semiconductor fins 116, 117, 118, and 119. In some embodiments, a vertical projection of the gate contact 172' on the gate electrode 122 shown in FIG. 1 is located within a contour of the gate electrode 122. In some embodiments, the direction where the gate contact 172' extended is intersected with a lengthwise direction of the semiconductor fin 116, 117, 118, and 119.

Reference is made to FIGS. 1, 2A, and 2B. In some embodiments, the gate contacts 172 and 173 are in a slot shape and also may be referred to as in a line shape. The longitudinal length X1' is larger than 2 times of the transversal length Y1'. In some embodiments, the longitudinal length X1' is larger than 4 times of the transversal length Y1' in the semiconductor device 100A.

FIGS. 3A, 3B, and 3C illustrate cross-sectional views along line A-A, line B-B, and line C-C in FIG. 1 respectively. As illustrated in FIGS. 3A, 3B, and 3C, the semiconductor device 100A includes a substrate 174 over which various elements of the semiconductor device 100A are formed. The elements of the semiconductor device 100A include active elements and/or passive elements. In some embodiments, active elements are arranged in a circuit region of the semiconductor device to provide one or more functions and/or operations intended to be performed by the semiconductor device. Examples of active elements include, but are not limited to, transistors and diodes. A plurality of metal layers and via layers are alternatingly formed over the substrate 174 to electrically couple the elements of the semiconductor device 100A with each other and/or with external devices. In some embodiments, the substrate 174 includes a silicon substrate. In some embodiments, the substrate 174 includes silicon germanium (SiGe), Gallium arsenic, P-type doped Si, N-type doped Si, or suitable semiconductor materials. For example, semiconductor materials including group III, group IV, and group V elements are within the scope of various embodiments. In some embodiments, the substrate 174 further includes one or more other features, such as various doped regions, a buried layer, and/or an epitaxy (epi) layer. In some embodiments, the substrate 174 includes a semiconductor on insulator, such as silicon on insulator (SOI). In some embodiments, the substrate 174 includes a doped epi layer, a gradient semiconductor layer, and/or a semiconductor layer overlying another semiconductor layer of a different type such as a silicon layer on a silicon germanium layer.

The semiconductor device 100A further includes one or more well regions over the substrate 174. In some embodiments, the n-well region 113 and p-well region 114 are over the substrate 174, as described with respect to FIG. 1.

The semiconductor device 100A further includes one or more isolation structures over and around the well regions 113 and 114. In the example configuration in FIGS. 3A, 3B, and 3C, the isolation structure 175 is over the well regions 113 and 114. The isolation structure 175 electrically isolates various elements of the semiconductor device 100A from each other. For example, as illustrated in FIGS. 3B and 3C, the isolation structure 175 electrically isolates the semiconductor fins 116 and 117 in the active area region 111 from the semiconductor fins 118 and 119 in the active area region 112. In some embodiments, the isolation structure 175 includes one or more shallow trench isolation (STI) regions. Example materials of the STI regions include, but are not limited to, silicon oxide, silicon nitride, silicon oxynitride, fluoride-doped silicate, and/or any other low k dielectric materials.

In the example configuration in FIGS. 3A, 3B, and 3C, the semiconductor device 100A includes active area regions 111 and 112 (best seen in FIGS. 3B and 3C), gate electrodes 121, 122, 123, and 124, gate dielectric layers 186, 187, 188, and 189 (best seen in FIG. 3A), and the corresponding gate spacers 132, 134, 136, and 138 (best seen in FIG. 3A) over the isolation structure 175. Other arrangements are within the scope of various embodiments. For example, in some embodiments, the gate electrodes 121, 122, 123, and 124 and/or some of the corresponding gate spacers 132, 134, 136, and 138 are partially embedded in the isolation structure 175.

In some embodiments, the gate electrodes 121, 122, 123, and 124 include one or more conductive layers and/or materials. In the example configuration in FIG. 3B, the gate electrode 122 is wrapped over the fins 116, 117, 118, and 119, and includes a first conductive gate material 122a over the n-well region 113 and a second conductive gate material 122b over the p-well region 114. In some embodiments, the conductive gate materials 122a and 122b include the same conductive material. In some embodiments, the conductive gate materials 122a and 122b include different conductive materials. In some embodiments, the conductive material or materials of at least one of the conductive gate materials 122a and 122b is/are selected in accordance with the type of device or transistor. For example, each of the conductive gate materials 122a and 122b includes a conductive work function layer and a contact layer over the conductive work function layer.

In some embodiments, the first conductive gate material 122a includes a p-type work function metal (p-metal) for forming a PMOS over the n-well region 113. Example p-metals include, but are not limited to, TiN, TaN, a carbon-doped metal nitride such as TaCN. In some embodiments, the second conductive gate material 122b includes an n-type work function metal (n-metal) for forming an NMOS over the p-well region 114. Example n-metals include, but are not limited to, Ta, TiAl, and TiAlN. Other work function materials are within the scope of various embodiments. For example, in some embodiments, the work function layer includes doped conducting oxide materials, TaAl, TiSi, NiSi, PtSi, suitable Ti containing work function materials, suitable Ta containing work function materials, suitable Al containing work function materials, and suitable W containing work function materials. In the example configuration in FIG. 3A, the top surfaces of the gate electrodes 121, 122, 123, and 124 are flush with each other due to, e.g., a planarization process during manufacture. Other arrangements are within the scope of various embodiments.

To electrically isolate the gate electrodes 121, 122, 123, and 124 from the fins 116, 117, 118, and 119, gate dielectric layers 186, 187, 188, and 189 are arranged under and around the corresponding gate electrodes 121, 122, 123, and 124. In FIG. 3B, the first conductive gate material 122a and the second conductive gate material 122b are isolated from the fins 116, 117, 118, and 119 by a corresponding gate dielectric layer 187a over the n-well region 113 and a corresponding gate dielectric layer 187b over the p-well region 114. The gate dielectric layers 187a and 187b configure the gate dielectric layer 187 described with respect to FIG. 3A. In some embodiments, the gate dielectric layers 187a and 187b include the same dielectric material. In some embodiments, the gate dielectric layers 187a and 187b include different dielectric materials. In the example configuration in FIG. 3B, the gate electrode 122 extends continuously from the n-well region 113 into the p-well region 114, and the first conductive gate material 122a is in contact with the second conductive gate material 122b. Other arrangements are within the scope of various embodiments. For example, in some embodiments, at least one of the gate dielectric layers 187a and 187b is interposed between and electrically isolates the first conductive gate material 122a and the second conductive gate material 122b. In some embodiments, at least one of the gate dielectric layers 187a and 187b includes one or more of $HfO_2$, $Ta_2O_5$ and $Al_2O_3$.

Example materials of the gate dielectric layers include, but are not limited to, a high-k dielectric layer, an interfacial layer, and/or combinations thereof. Example materials for the high-k dielectric layer include, but are not limited to, silicon nitride, silicon oxynitride, hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, suitable high-k dielectric materials, and/or combinations thereof. In some embodiments, a gate dielectric layer includes multi-layer structure of, for example, $SiO_2$ with a high-k dielectric, or SiON with a high-k dielectric.

In some embodiments, the work function layer, the contact layer and the gate dielectric layer configure a gate stack structure. In some embodiments, the gate stack structure includes a $Si_3N_4$/metals/high-K dielectric structure. The gate spacers 132, 134, 136, and 138 are over opposite sides of the corresponding gate dielectric layers 186, 187, 188, and 189 respectively.

In the example configuration in FIGS. 3A, 3B, and 3C, the semiconductor device 100A further includes source/drains 131, 133, and 135. The source/drains 131, 133, and 135 are arranged between adjacent gate electrodes 121, 122, 123, and 124. In some embodiments, portions of the fin 116 between the adjacent spacers are recessed to form S/D cavities having bottom surfaces lower than the top surface of the fin 116. After the formation of the S/D cavities, source/drains 131, 133, 135 are produced by epi-growing a strained material in the S/D cavities. In some embodiments, the lattice constant of the strained material is different from the lattice constant of the substrate 174. Thus, channel regions of the semiconductor device are strained or stressed to enhance carrier mobility of the device. For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the PMOS device. Examples of the strained material include, but are not limited to, SiGe, SiGeC, SiC, GeSn, SiGeSn, SiP, SiCP and other suitable materials. In some embodiments, the strained material for a PMOS device includes SiGe, SiGeC, Ge, Si, or a combination thereof. In some embodiments, the strained material for an NMOS device includes SiC, SiP, SiCP, Si, or a combination thereof. In the example configuration in FIG. 3A, upper surfaces of the strained material in the source/drains 131, 133, and 135 extend upward above top surface of the fin 116. Other arrangements are within the scope of various embodiments. For example, in some embodiments, upper surfaces of the strained material in the source/drains 131, 133, and 135 are lower than the top surface of the fin 116.

In the example configuration in FIGS. 3A, 3B, and 3C and combined with FIG. 1, the semiconductor device 100A further includes S/D contact 141, 142, 143, 144, 145, and 146 are arranged in the spaces between adjacent gate spacers. In the example configuration in FIG. 3A, the S/D contact 141 is arranged in the space between adjacent gate spacers 132 and 134. At least one side face of the contact 141 is spaced from an adjacent side face of the gate spacer 132 or 134, by a portion of the interlayer dielectric (ILD) layer 176. In the example configuration in FIG. 3A, the top surfaces of the S/D contacts 141, 143, and 145 are flush with each other due to, e.g., a planarization process during manufacture. Other arrangements are within the scope of various embodiments. In some embodiments, the ILD layer 176 has a dielectric constant less than 4 and is less than that of the barrier layer 182 and/or 183.

In the semiconductor device 100A, the S/D contact 141, 142, 143, 144, 145, and 146 are in contact with corresponding source/drains. In the example configuration in FIG. 3A, the fin 116 includes source/drains 131, 133, and 135 which are in contact with the corresponding S/D contact 141, 143, and 145. In the example configuration in FIG. 3A, boundaries of one or more of the S/D contacts 141, 143, and 145 are surrounded by the S/D contact barrier layers 151, 153, and 155 respectively and are spaced from boundaries of the gate spacers 132, 134, 136, and 138. In some embodiment, as shown in FIG. 3A, a silicide 331 is disposed between the source/drain 131 and the S/D contact 145, a silicide 333 is disposed between the source/drain 133 and the S/D contact 143, and a silicide 335 is disposed between the source/drain 135 and the S/D contact 141. In some embodiment, as shown in FIG. 3C, a silicide 337 is disposed between the source/drain 137 and the S/D contact 144.

In the semiconductor device 100A, the gate contact 172 and 173 are arranged in the spaces between adjacent S/D contacts. In the example configuration in FIG. 3A, the gate contact 172 is arranged in the space between adjacent S/D contacts 141 and 143. At least one side face of the gate contact 172 is spaced from an adjacent side face of the S/D contact 141 or 143, by a portion of the ILD layer 176. The gate contact 172 and 173 are in contact with corresponding gate electrodes. In the example configuration in FIGS. 3A and 3B, the gate contact 172 is in contact with the gate electrode 122. In the example configuration in FIGS. 3A and 3B, a boundary of the gate contact 172 is surrounded by the gate contact barrier layer 182 and is spaced from boundaries of the S/D contacts 141 and 143. In the example configuration in FIG. 3A, the top surfaces of the gate contact 172 is flush with the S/D contacts 141, 143, and/or 145 due to, e.g., a planarization process during manufacture. Other arrangements are within the scope of various embodiments.

In the example configuration in FIGS. 3A, 3B, and 3C, the semiconductor device 100A further includes an inter-layer dielectric (ILD) layer 176 over the isolation structure 175. Example materials of the ILD layer 176 include, but are not limited to, SiNx, SiOx, SiON, SiC, SiBN, SiCBN, or combinations thereof. The ILD layer 176 embeds therein the gate electrodes 121, 122, 123, and 144, and/or the corresponding gate spacers 132, 134, 136, and 138 (as best seen in FIG. 3A). The ILD layer 176 further embeds therein the fins 116, 117, 118, and 119 of the active area regions 111 and 112, the S/D contacts 141, 142, 143, 144, 145, and 146, and the gate contacts 172 and 173. For the sake of simplicity, the S/D contact in the ILD layer 176 of the semiconductor device 100A are designated by the same reference numerals of the corresponding S/D contact in the layout 100 and the gate contact in the ILD layer 176 of the semiconductor device 100A are designated by the same reference numerals of the corresponding gate contact in the layout 100.

In the example configuration in FIGS. 3A, 3B, and 3C, the semiconductor device 100A includes an inter-metal dielectric (IMD) layer 178 over the ILD layer 176. Example materials of the IMD layer 178 include, but are not limited to, SiNx, SiOx, SiON, SiC, SiBN, SiCBN, or combinations thereof. The IMD layer 178 embeds therein gate vias 191 and 192, S/D vias 163, 164, 165, and 166, and/or the conductive lines 201, 202, 203, 204, 205, 206, and 207.

As shown in FIGS. 3A and 3B, the gate via 192 overlaps the gate contact 172 and is connected to the conductive line 203. As shown in FIGS. 3A and 3C, the S/D vias 163 and 164 overlap the S/D contacts 143 and 144 respectively and are connected to the conductive line 202 and 205 respectively. The conductive lines 201, 202, 203, 204, 205, 206, and 207 extend along the Y direction of the layout 100 shown in FIG. 1. In some embodiments, the conductive lines 201, 202, 203, 204, 205, 206, and 207 are in a first interconnection layer of the layout 100, such as a first metal layer. As shown in FIGS. 3A and 3C, the conductive lines 202 and 205 overlap and are electrically connected to the S/D contacts 143 and 144 through the S/D vias 163 and 164 respectively. The conductive line 203 overlaps and is electrically connected to the gate contact area 172 through the gate via 192 and is between adjacent two of the conductive lines 202 and 204 which are without passing through the gate vias 192.

Figure 4:
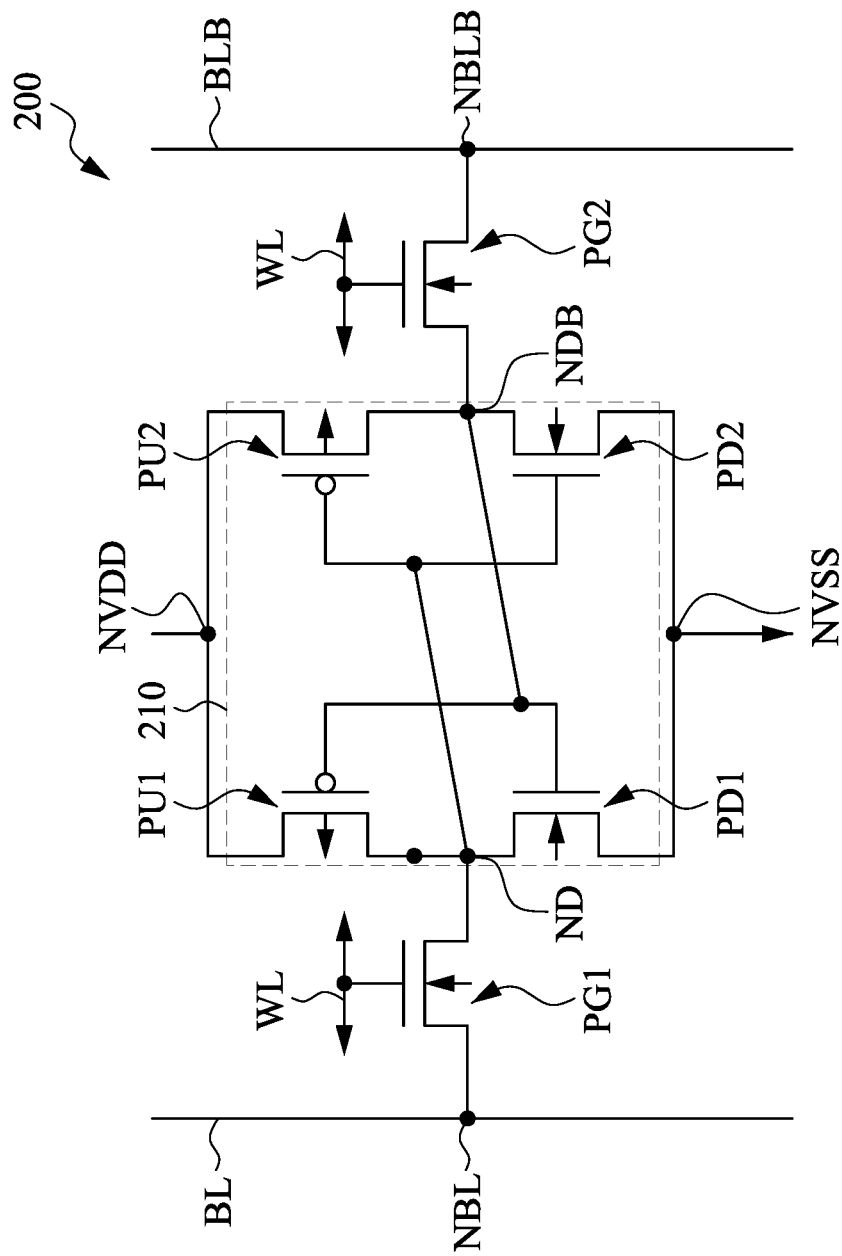
FIG. 4 illustrates a circuit schematic for a single-port SRAM cell in accordance with some embodiments.

FIG. 4 illustrates a circuit schematic for a single-port SRAM cell 200 in accordance with some embodiments. The single-port SRAM cell 200 includes a storage circuit 210 having data nodes ND and NDB, two pass gate devices PG1 and PG2, a supply voltage node NVDD, a reference voltage node NVSS, a first bit line BL, a second bit line BLB, and a word line WL. The pass gate device PG1 is electrically coupled with the data node ND, the bit line BL, and the word line WL. The pass gate device PG2 is electrically coupled with the data node NDB, the bit line BLB, and the word line WL.

The pass gate devices PG1 and PG2 can be N-type metal oxide semiconductor (NMOS) transistors. A drain of the pass gate device PG1 is electrically coupled with the bit line BL at the node NBL. A source of the pass gate device PG1 is electrically coupled with the data node ND. A drain of the pass gate device PG2 is electrically coupled with the bit line BLB at the node NBLB. A source of the pass gate device PG2 is electrically coupled with the data node NDB. A gate of the pass gate device PG1 and a gate of the pass gate device PG2 are electrically coupled with the word line WL. The gates of the pass gate devices PG1 and PG2 are control terminals thereof configured to receive a control signal for turning on or off the pass gate devices PG1 and PG2.

The storage circuit 210 includes two pull up devices PU1 and PU2 and two pull down devices PD1 and PD2. The two pull up devices PU1 and PU2 can be P-type metal oxide semiconductor (PMOS) transistors, and the two pull down devices PD1 and PD2 can be N-type metal oxide semiconductor (NMOS) transistors. The pull up devices PU1 and PU2 and the pull down devices PD1 and PD2 form a cross latch having two cross-coupled inverters. The pull up device PU1 and pull down device PD1 form a first inverter while the pull up device PU2 and pull down device PD2 form a second inverter. Drains of the pull up device PU1 and the pull down device PD1 are coupled together and form the data node ND. Drains of the pull up device PU2 and the pull down device PD2 are coupled together and form the data node NDB. Gates of the pull up device PU1 and the pull down device PD1 are coupled together and to the drains of the pull up device PU2 and the pull down device PD2. Gates of the pull up device PU2 and the pull down device PD2 are coupled together and to the drains of the pull up device PU1 and the pull down device PD1. Sources of the pull up devices PU1 and PU2 are coupled with the supply voltage node NVDD. In some embodiments, the supply voltage node NVDD is configured to receive a supply voltage VDD. The sources of the pull down devices PD1 and PD2 are coupled with the reference voltage node NVSS. In some embodiments, the reference voltage node NVSS is configured to receive a ground reference voltage VSS.

In some embodiments, the bit lines BL and BLB are coupled to each drain of the pass gate devices PG1 and PG2 of memory cells in a column of the memory array, and the word line WL is coupled to each gate of the pass gate devices PG1 and PG2 of memory cells in a row of the memory array. In some embodiments, each of the pass gate devices PG1 and PG2 has a first threshold voltage Vt1, and each of the pull up devices PU1 and PU2 has a second threshold voltage Vt2. In some embodiments, the present application is applicable to a multiple-port SRAM cell having one or more write ports and/or one or more read ports.

Figure 5:
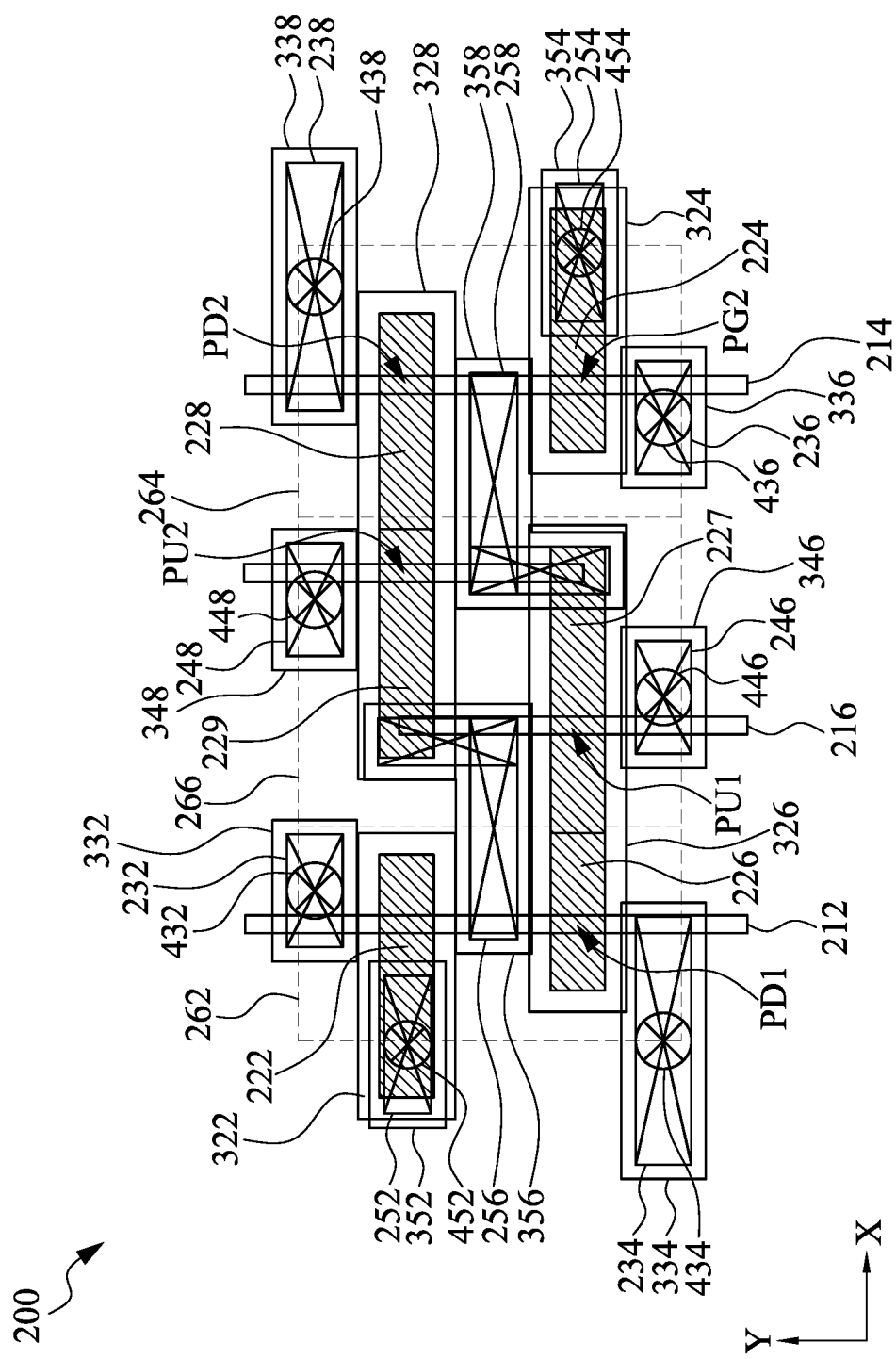
FIG. 5 illustrates a layout in a top view of the single-port SRAM cell shown in FIG. 4 in accordance with some embodiments.

FIG. 5 illustrates a layout in a top view of the single-port SRAM cell 200 shown in FIG. 4 in accordance with some embodiments. As shown in FIG. 5, the single-port SRAM cell 200 includes a substrate 274 (shown in FIGS. 8A and 8B) having P-well regions 262 and 264 and an N-well region 266 between the P-well regions 262 and 264. The single-port SRAM cell 200 includes a plurality of semiconductor fins 212, 214, 216, and 218 (may also refer to as fin lines) extending along the direction Y, a plurality of gate electrodes 222, 224, 226, 227, 228, and 229 extending along the direction X, a plurality of gate spacers 322, 324, 326, and 328, a plurality of gate contact 252 and 254, a plurality of gate contact barrier layers 352 and 354, a plurality of gate vias 452 and 454, a plurality of S/D contacts 232, 234, 236, 238, 246, and 248, a plurality of S/D contact barrier layers 332, 334, 336, 338, 346, and 348, a plurality of S/D vias 432, 434, 436, 438, 446, and 448, a plurality of butt contacts 256 and 258, and a plurality of butt contact barrier layers 356 and 358.

The semiconductor fins 212 and 214 are respectively in the P-well regions 262 and 264 for forming N-type transistors, such as NMOS transistors. The semiconductor fins 216 and 218 are in the N-well region 266 forming P-type transistors, such as PMOS transistors. The semiconductor fins 212, 214, 216, and 218 are formed on the substrate 274 shown in FIGS. 8A and 8B. The number of fins for each transistor depicted in FIG. 5 is provided as an example. In some embodiments, any number of fins is within the scope of various embodiments. In some embodiments, the semiconductor fins 212, 214, 216, and 218 are integrally formed with the substrate 274.

The gate electrode 226 overlaps the semiconductor fin 212 and functions as a gate of the pull down device PD1. That is, the semiconductor fin 212 and the gate electrode 226 form the pull down device PD1. The S/D contact 234 and butt contact 256 overlap the semiconductor fin 212 and correspond to a source contact and a drain contact of the pull down device PD1. The gate electrode 227 overlaps the semiconductor fin 216 and functions as a gate of the pull up device PU1. That is, the semiconductor fin 216 and the gate electrode 227 form the pull up device PU1. The S/D contact 246 and the butt contact 256 overlap the semiconductor fin 216 and correspond to a source contact and a drain contact of the pull up device PU1. The gate electrode 228 overlaps the semiconductor fin 214 and functions as a gate of the pull down device PD2. That is, the semiconductor fin 214 and the gate electrode 228 form the pull down device PD2. The S/D contacts 238 and 236 overlap the semiconductor fin 214 and correspond to a source contact and a drain contact of the pull down device PD2. The gate electrode 229 overlaps the semiconductor fin 218 and functions as a gate of the pull up device PU2. That is, the semiconductor fin 218 and the gate electrode 229 form the pull up device PU2. The S/D contact 248 and the butt contact 258 overlap the semiconductor fin 218 and correspond to a source contact and a drain contact of the pull up device PU2. The butt contact 256 connects the gate electrode 229 to electrically interconnect and the semiconductor fins 212 and 216. The butt contact 258 connects the gate electrode 227 to electrically interconnect the semiconductor fins 214 and 218. Accordingly, the S/D contact 246 and 248 correspond to the node NVDD shown in FIG. 4, and the S/D contact 234 and 238 correspond to the reference voltage node NVSS shown in FIG. 4.

The gate electrode 222 overlaps the semiconductor fin 212 and functions as a gate of the pass gate device PG1. That is, the semiconductor fin 212 and the gate electrode 222 form the pass gate device PG1. The S/D contact 232 and butt contact 256 overlap the semiconductor fin 212 and correspond to a source contact and a drain contact of the pass gate device PG1. The gate contact 252 contacts the gate electrode 222 and functions as a landing pad for the gate electrode 222 to electrically interconnect the gate electrode 222 to the word line WL of FIG. 4. The gate electrode 224 overlaps the semiconductor fin 214 and functions as a gate of the pass gate device PG2. That is, the semiconductor fin 214 and the gate electrode 224 form the pass gate device PG2. The S/D contact 236 and the butt contact 258 overlap the semiconductor fin 214 and correspond to a source contact and a drain contact of the pass gate device PG2. The gate contact 254 contacts the gate electrode 224 and functions as a landing pad for the gate electrode 224 to electrically interconnect the gate electrode 224 to the word line WL of FIG. 4. Accordingly, the S/D contact 232 corresponds to the node NBL, and the S/D contact 236 corresponds to the node NBLB. The gate contact 173 is between the S/D contacts 144 and 146. In some embodiments, the gate contacts 252 and 254 are in a slot shape and may be also refer to as in a line shape. Example materials of the gate contacts 252 and 254 include Ti, TiN, TaN, Co, Ru, Pt, W, Al, Cu, or any combinations thereof.

In the example configuration in FIG. 5, boundaries of one or more of the gate contacts 252 and 254 are surrounded by the gate contact barrier layers 352 and 354 respectively. In some embodiments, a thickness of at least one of the gate contact barrier layers 352 and 354 is in a range from about 5 Å to about 50 Å. In some embodiments, the gate contact barrier layers 352 and 354 include Hf oxide ($HfO_2$), Ta oxide ($Ta_2O_5$), Ti oxide ($TiO_2$), Zr oxide ($ZrO_2$), Al oxide (Al2O3), Y oxide (Y2O3), or any combinations thereof. In some embodiments, at least one of the gate contacts 252 and 254 has a dielectric constant larger than 4.9.

The gate vias 452 and 454 overlap the gate contacts 252 and 254 respectively. The gate vias 452 and 454 are in a circle shape. For example, the length ratio of longer side to short side of at least one of the 452 and 454 is less than 1.2.

Example materials of the S/D contacts 232, 234, 236, 238, 246, and 248 include Ti, TiN, TaN, Co, Ru, Pt, W, Al, Cu, or any combinations thereof. In some embodiments, the S/D contacts 232, 234, 236, 238, 246, and 248 are in a slot shape and may be also refer to as in a line shape. For example, the length ratio of longer side to short side of at least one of the S/D contact 232, 234, 236, 238, 246, and 248 is larger than 2. In some embodiments, the S/D contacts 232, 234, 236, 238, 246, and 248 are made of a material that is the same as the gate contacts 252 and 254. Alternatively, in some embodiments, the S/D contacts 232, 234, 236, 238, 246, and 248 are made of a material that is different from the gate contacts 252 and 254.

In addition, boundaries of one or more of the S/D contact 232, 234, 236, 238, 246, and 248 are surrounded by the S/D contact barrier layers 332, 334, 336, 338, 346, and 348 respectively and are spaced from boundaries of the gate spacers 322, 324, 326, and 328. In addition, boundaries of one or more of the butt contacts 256 and 258 are surrounded by the butt contact barrier layers 356 and 358 respectively and are spaced from boundaries of the gate spacers 322, 324, 326, and 328. For example, an upper edge of the butt contact 256 is spaced in the Y direction from an adjacent lower edge of the gate spacer 322 by the butt contact barrier layer 356, and a lower edge of the butt contact 256 is spaced in the Y direction from an adjacent upper edge of the gate spacer 326 by the butt contact barrier layer 356.

In some embodiments, a thickness of at least one of the S/D contact barrier layers 332, 334, 336, 338, 346, and 348 and the butt contact barrier layers 356 and 358 is in a range from about 5 Å to about 50 Å. Example materials of the S/D contact barrier layers 332, 334, 336, 338, 346, and 348 and the butt contact barrier layers 356 and 358 include high-K dielectric, such as nitride-base high-K dielectric or metal oxide high-K dielectric. In some embodiments, the S/D contact barrier layers 332, 334, 336, 338, 346, and 348 and the butt contact barrier layers 356 and 358 are made of Si3N4. In some embodiments, the S/D contact barrier layers 332, 334, 336, 338, 346, and 348 and the butt contact barrier layers 356 and 358 include Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or any combinations thereof. In some embodiments, the S/D contact barrier layers 332, 334, 336, 338, 346, and 348 and the butt contact barrier layers 356 and 358 are made of a material that is the same as the gate contact barrier layers 352 and 354. Alternatively, in some embodiments, the S/D contact barrier layers 332, 334, 336, 338, 346, and 348 and the butt contact barrier layers 356 and 358 are made of a material that is different from the gate contact barrier layers 352 and 354.

The S/D vias 432, 434, 436, 438, 446, and 448 overlap and are in contact with the S/D contacts 232, 234, 236, 238, 246, and 248 respectively. The S/D vias 432, 434, 436, 438, 446, and 448 are in a circle shape. For example, the length ratio of longer side to short side of at least one of the S/D vias 432, 434, 436, 438, 446, and 448 is less than 1.2. One of the S/D vias 432, 434, 436, 438, 446, and 448 has a top surface with an area which is larger than that of one of the gate vias 452 and 454. In other words, one of the S/D vias 432, 434, 436, 438, 446, and 448 has a first vertical projection projected on the substrate, one of the gate vias 452 and 454 has a second vertical projection projected on the substrate, and a first area of the first vertical projection is larger than a second area of the second vertical projection. In some embodiments, the first area of the first vertical projection is larger than the second area of the second vertical projection about 20%.

The gate spacers 322, 324, 326, and 328 are at least arranged along sides of the corresponding plurality of gate electrodes 222, 224, 226, 227, 228, and 229. For example, the gate spacers 322 are arranged along longitudinal sides of the gate electrode 222 in the X direction, the gate spacer 328 are arranged along longitudinal sides of the gate electrodes 228 and 229, the gate spacer 326 is arranged along longitudinal sides of the gate electrodes 226 and 227, and the gate spacer 324 is arranged along longitudinal sides of the gate electrode 224. The gate spacers 322, 324, 326, and 328 include one or more dielectric materials for electrically isolating the corresponding gate electrodes from unintended electrical contact. Example dielectric materials of the gate spacers 1322, 324, 326, and 328 include, but are not limited to, silicon nitride, oxynitride and silicon carbide. In some embodiments, one or more of the gate spacers 322, 324, 326, and 328 have a tapered profile as described herein.

In FIG. 5, the single-port SRAM cell 200 has a cell width W measurable along the direction X and a cell height H measurable along the direction Y. In some applications, a memory macro is formed by repeating and abutting memory cells having a configuration identical or mirrored-identical to the single-port SRAM cell 200, and thus cell width W is also referred to as a cell pitch along the direction X, and cell height H is also referred to as a cell pitch along the direction Y. In some embodiments, a ratio of cell width W to cell height H is greater than one.

Figure 6:
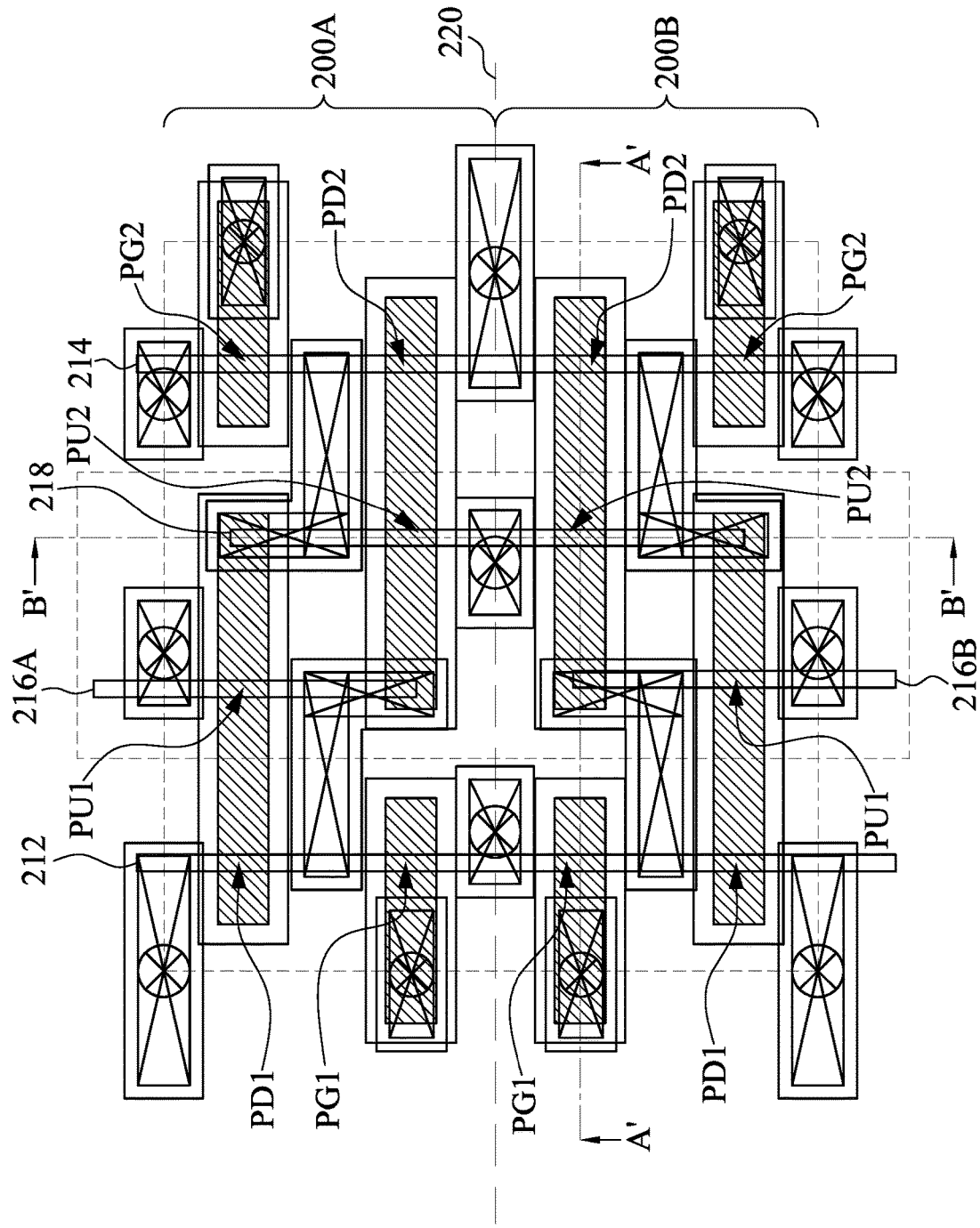
FIG. 6 illustrates a layout of the two abutting SRAM cells of FIG. 5 in a top view in accordance with some embodiments.

FIG. 6 illustrates a layout of the two abutting SRAM cells of FIG. 5 in a top view in accordance with some embodiments. In FIG. 6, the SRAM cell 200A is "flipped upside down" and joined with the SRAM cell 200B, which is not flipped. In other words, the SRAM cells 200A and 200B are symmetrically disposed around an axis 220.

As discussed above with reference to FIG. 5, the NMOSFET fin lines 212 and 214 (located over the P-type well region) extend continuously through at least the two SRAM cells 200A and 200B. In comparison, the SRAM cells 200A and 200B have discontinuous PMOSFET fin lines. For example, the semiconductor fins 216A, 216B and 218 are PMOSFET fin lines located over the N-type well region and have the SiGe content. The semiconductor fin 216A extends partially into the SRAM cell 200A but does not extend into the SRAM cell 200B, the semiconductor fin 218 extends partially (but not completely) into both the SRAM cells 200A and 200B, and the semiconductor fin 216B extends partially into the SRAM cell 200B but does not extend into the SRAM cell 200A. The semiconductor fins 216A, 216B, and 218 are also not connected to one another. The discontinuous semiconductor fins 216A, 216B, and 218 each end in the drain side of the pull up transistors PU1 or PU2. This type of broken fin line layout is used herein to prevent or reduce data node leakage between the pull up transistor drain node of one SRAM cell 200A and the pull up transistor drain node of an adjacent SRAM cell 200B.

Figure 7B:
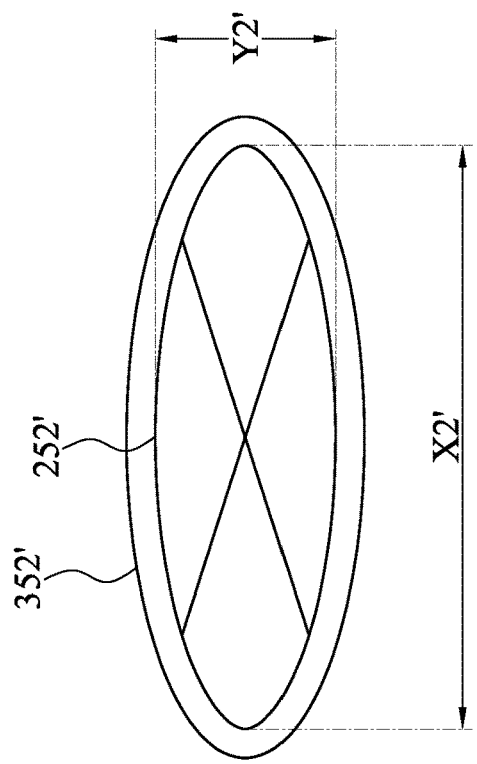
FIGS. 7A and 7B are top views of a shape of a gate contact in a layout and a final shape of the gate contact in a dielectric layer of a semiconductor device respectively in accordance with some embodiments.
Figure 7A:
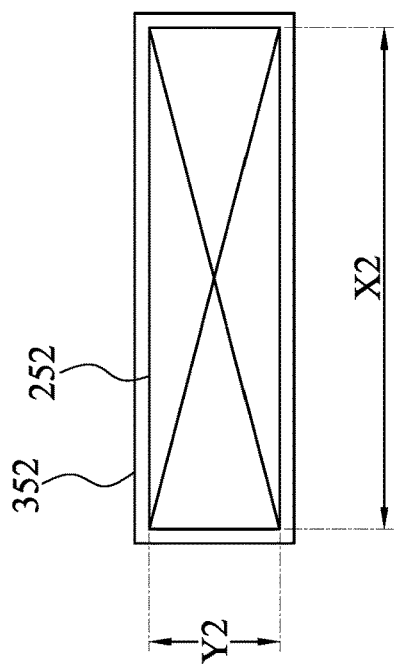

FIGS. 7A and 7B are top views of a shape of the gate contact 252 in the layout and a final shape of the gate contact 252' in a dielectric layer of a semiconductor device respectively in accordance with some embodiments. The details regarding the components in FIGS. 7A and 7B may thus be found in the discussion of the embodiment shown in FIG. 6. In FIGS. 7A and 7B, the gate contact 252' is formed in a dielectric layer 276 (shown in FIG. 8B) based on the shape of the gate contact 252 in the layout. The gate contact 252' has a longitudinal length X2' extended in a direction parallel to the X direction and has a transversal length Y2' extended in a direction parallel to the Y direction, in which the longitudinal length X2' runs in a direction of a long axis of the gate contact 252', the transversal length Y2' runs in a direction of a short axis of the gate contact 252', and the longitudinal length X2' is substantially orthogonal to the transversal length Y2'. In some embodiments, the shape of the gate contact 252' is in a shape of an ellipse. In some embodiments, the longitudinal length X2' is parallel to a longitudinal direction of the gate electrode.

Reference is made to FIGS. 5, 7A, and 7B. In some embodiments, the gate contacts 252 and 254 are in a slot shape and also may be referred to as in a line shape. The longitudinal length X2' is larger than 2 times of the transversal length Y2'. In some embodiments, the longitudinal length X2' is larger than 4 times of the transversal length Y2' in the SRAM cells 200A and 200B.

FIGS. 8A and 8B are cross-sectional views along line A'-A' and line B'-B' in FIG. 6 respectively. The SRAM cells 200A and 200B includes a substrate 274. In some embodiments, the substrate 274 includes a silicon substrate. In some embodiments, the substrate 274 includes silicon germanium (SiGe), Gallium arsenic, P-type doped Si, N-type doped Si, or suitable semiconductor materials. For example, semiconductor materials including group III, group IV, and group V elements are within the scope of various embodiments. In some embodiments, the substrate 274 further includes one or more other features, such as various doped regions, a buried layer, and/or an epitaxy (epi) layer. In some embodiments, the substrate 274 includes a semiconductor on insulator, such as silicon on insulator (SOI). In some embodiments, the substrate 274 includes a doped epi layer, a gradient semiconductor layer, and/or a semiconductor layer overlying another semiconductor layer of a different type such as a silicon layer on a silicon germanium layer.

The SRAM cells 200A and 200B further includes one or more well regions over the substrate 274. In some embodiments, the P-well regions 262 and 264 and N-well region 266 are over the substrate 274.

The SRAM cells 200A and 200B further includes one or more isolation structures over and around the P-well regions 262 and 264 and N-well region 266. The isolation structure 275 electrically isolates various elements of the SRAM cells 200A and 200B from each other. For example, as illustrated in FIGS. 8A and 8B, the isolation structure 275 electrically isolates the fins 212 from the fins 216B, 218, and 214. In some embodiments, the isolation structure 275 includes one or more shallow trench isolation (STI) regions. In the cross-section shown in FIG. 8B, the isolation structure 275 has a thickness less than the fin 218; however, outside the cross-section shown in FIG. 8B, the isolation structure 275 includes regions where the thickness of the isolation structure 275 is higher, as indicated by the arrow designated with "STI thickness" in FIG. 8B. Example materials of the STI regions include, but are not limited to, silicon oxide, silicon nitride, silicon oxynitride, fluoride-doped silicate, and/or any other low k dielectric materials.

In the example configuration in FIGS. 8A and 8B, the SRAM cells 200A and 200B further includes semiconductor fins 212, 214, 216B, and 218 (best seen in FIG. 8A), the gate electrodes 222B, 229B, and 228B shown in FIG. 8A and the gate electrodes 227A, 227B, 229A, and 229B shown in FIG. 8B, and corresponding gate spacers 326A, 326B, 328A, and 328B (best seen in FIG. 8B) over the isolation structure 275. Other arrangements are within the scope of various embodiments. For example, in some embodiments, the gate electrodes 222B, 227A, 227B, 229A, and 229B are partially embedded in the isolation structure 175. As shown in FIG. 8B, the gate electrodes 227A, 227B, 229A, and 229B are over the semiconductor fin 218.

In some embodiments, the gate electrodes 227A, 227B, 228A, 228B, 229A, and 229B each include one or more conductive layers and/or materials. In the example configuration in FIG. 8A, the gate electrode 228B is over the P-well regions 264, the gate electrode 229B is over the N-well region 266, and the gate electrode 222B is over the P-well regions 262. In some embodiments, the gate electrodes 228B and 229B include the same conductive material. In some embodiments, the gate electrodes 228B and 229B include different conductive materials. In some embodiments, the conductive material or materials of at least one of the gate electrodes 228B and 229B is/are selected in accordance with the type of device or transistor. For example, each of the gate electrodes 228B and 229B includes a conductive work function layer and a contact layer over the conductive work function layer.

In some embodiments, the gate electrode 229B includes a p-type work function metal (p-metal) for forming a PMOS over the N-well region 266. Example p-metals include, but are not limited to, TiN, TaN, a carbon-doped metal nitride such as TaCN. In some embodiments, the gate electrode 228B includes an n-type work function metal (n-metal) for forming an NMOS over the P-well regions 264. Example n-metals include, but are not limited to, Ta, TiAl, and TiAlN. Other work function materials are within the scope of various embodiments. For example, in some embodiments, the work function layer includes doped conducting oxide materials, TaAl, TiSi, NiSi, PtSi, suitable Ti containing work function materials, suitable Ta containing work function materials, suitable Al containing work function materials, and suitable W containing work function materials.

The SRAM cells 200A and 200B further includes gate electrodes and gate dielectric layers. In the example configuration in FIG. 8A, the gate electrodes 222B, 228B, and 229B wrap over the semiconductor fins 212, 214, 216B, and 218. To electrically isolate the gate electrodes 222B, 228B, 229B from the semiconductor fins 212, 214, 216B, and 218, gate dielectric layers 387B, 389B, and 388B are arranged under and around the corresponding gate electrodes 222B, 228B, 229B as shown in FIG. 8A and gate dielectric layers 388A, 388B, 389A, and 389B are arranged under and around the corresponding gate electrodes 227A, 227B, 229A, and 229B as shown in FIG. 8B. In some embodiments, as shown in FIG. 8A, the gate dielectric layers 388B and 389B include the same dielectric material. In some embodiments, the gate dielectric layers 388B and 389B include different dielectric materials. In the example configuration in FIG. 8A, the gate electrodes 228B and 229B extend continuously from the P-well regions 264 to the N-well region 266, and the gate electrode 228B is in contact with the gate electrode 229B. Other arrangements are within the scope of various embodiments.

Example materials of the gate dielectric layers include, but are not limited to, a high-k dielectric layer, an interfacial layer, and/or combinations thereof. Example materials for the high-k dielectric layer include, but are not limited to, silicon nitride, silicon oxynitride, hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina (HfO$_2$—Al$_2$O$_3$) alloy, suitable high-k dielectric materials, and/or combinations thereof. In some embodiments, a gate dielectric layer includes multi-layer structure of, for example, SiO$_2$ with a high-k dielectric, or SiON with a high-k dielectric.

In some embodiments, the work function layer, the contact layer and the gate dielectric layer configure a gate stack structure. In some embodiments, the gate stack structure includes a Si$_3$N$_4$/metals/high-K dielectric structure. In FIG. 8B, the gate spacers 326A, 326B, 328A, and 328B are over opposite sides of the corresponding gate dielectric layers 388A, 388B, 389A, and 389B respectively.

The SRAM cells 200A and 200B further includes source/drains arranged between adjacent gate electrodes. As shown in FIG. 8B, the source/drains 281, 283, and 284 are arranged between adjacent gate electrodes 227A, 227B, 229A, and 229B. In some embodiments, portions of the semiconductor fin 218 between the adjacent gate spacers are recessed to form S/D cavities having bottom surfaces lower than the top surface of the semiconductor fin 218. After the formation of the S/D cavities, source/drains 281, 283, and 284 are produced by epi-growing a strained material in the S/D cavities. In some embodiments, the lattice constant of the strained material is different from the lattice constant of the substrate 274. Thus, channel regions of the semiconductor device are strained or stressed to enhance carrier mobility of the device. For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the PMOS device. Examples of the strained material include, but are not limited to, SiGe, SiGeC, SiC, GeSn, SiGeSn, SiP, SiCP and other suitable materials. In some embodiments, the strained material for a PMOS device includes SiGe, SiGeC, Ge, Si, or a combination thereof. In some embodiments, the strained material for an NMOS device includes SiC, SiP, SiCP, Si, or a combination thereof. In the example configuration in FIG. 8B, upper surfaces of the strained material in the source/drains 281, 283, and 284 extend upward above top surface of the semiconductor fin 218. Other arrangements are within the scope of various embodiments. For example, in some embodiments, upper surfaces of the strained material in the source/drains 281, 283, and 284 are lower than the top surface of the semiconductor fin 218. In the example configuration in FIG. 8B and as best seen in FIG. 6, the gate electrodes 227A, 227B, 229A, and 229B correspond to gates of the PU1 transistors and PU2 transistors, the source/drains 281, 283, and 284 correspond to source/drains of the PU2 transistors. In some embodiments, the source/drains 281, 283, and 284 include strained material including, but are not limited to, SiGe, SiC, and SiP.

As shown in FIG. 8A, the butt contact 256B and the gate contact 252 are in contact with corresponding gate electrodes. In the example configuration in FIG. 8A, the gate electrode 222B is in contact with the gate contact 252 and the gate electrode 229B is in contact with the butt contact 256. A boundary of the gate contact 252 is surrounded by the gate contact barrier layers 352 and a boundary of the butt contact 256 is surrounded by the butt contact barrier layer 356.

As shown in FIG. 8B, the butt contacts 258A and 258B and the S/D contact 248 are arranged in the spaces between adjacent gate spacers. The butt contact 258A is arranged in the space between adjacent gate spacers 326A and 328A. At least one side face of the butt contact 258A is spaced from an adjacent side face of the gate spacer 326A and 328A. At least one side face of the butt contact 258B is spaced from an adjacent side face of the gate spacer 326B and 328B. At least one side face of the S/D contact 248 is spaced from an adjacent side face of the gate spacer 328A and 328B. In the example configuration in FIG. 8B, the top surfaces of the S/D contacts 258A, 258B, and 248 are flush with each other due to, e.g., a planarization process during manufacture. Other arrangements are within the scope of various embodiments.

In some embodiments, the butt contact 258B is over and electrically coupled the source/drain 281 to the gate electrode 227B. The butt contact 258A is over and electrically coupled the source/drain 284 to the gate electrode 227A. The S/D contact 248 is electrically coupled to the source/drain 283. In the example configuration in FIG. 8B, boundaries of one or more of butt contacts 258A and 258B and the S/D contact 248 are surrounded by the butt contact barrier layers 358A, 358B, and 348 respectively and are spaced from boundaries of the gate spacers 326A, 326B, 328A, and 328B. In the example configuration in FIG. 8B and as shown in FIG. 6, the butt contact 258B is electrically coupled to a storage node of a half-cell, the contact 248 is electrically coupled to first power supply node NVDD, and the butt contact 258A is electrically coupled to a storage node.

The SRAM cells 200A and 200B further includes an inter-layer dielectric (ILD) layer over the isolation structure and around semiconductor fins and gate electrodes. In the example configuration in FIGS. 8A and 8B, the SRAM cells 200A and 200B includes an inter-layer dielectric (ILD) layer 276 over the isolation structure 275 and around the semiconductor fin 218 and the gate electrodes 227A, 227B, 229A, and 229B. Example materials of the ILD layer 276 include, but are not limited to, SiNx, SiOx, SiON, SiC, SiBN, SiCBN, or combinations thereof. As shown in FIG. 8B, the ILD layer 276 embeds therein the semiconductor fins 212, 216B, 218, and 214, the gate electrodes 227A, 227B, 229A, and 229B and/or the corresponding gate spacers 326A, 326B, 328A, and 328B. As shown in FIGS. 8A and 8B, the ILD layer 276 further embeds therein the butt contacts 256B, 258A and 258B, the S/D contact 248, and the gate contact 252. For the sake of simplicity, the S/D contacts in the ILD layer 276 of the SRAM cells 200A and 200B are designated by the same reference numerals of the corresponding S/D contacts in the layout and the gate contacts in the ILD layer 276 of the SRAM cells 200A and 200B are designated by the same reference numerals of the corresponding gate contacts in the layout.

In some embodiments, a plurality of vias in the ILD layer 276 are electrically coupled the contacts to other elements of the SRAM cells 200A and 200B. For example, as shown in FIG. 8B, S/D via 448 is electrically coupled the S/D contact 248 to other elements of the SRAM cells 200A and 200B.

The SRAM cells 200A and 200B further includes an inter-metal dielectric (IMD) layer 279 over the ILD layer 276. The IMD layer 279 embeds therein interconnects, such as metal lines of the metal layer 450 for electrically coupling the vias in the ILD layer 276 to other elements of the SRAM cells 200A and 200B. In some embodiments, the SRAM cells 200A and 200B includes one or more further ILD layers and/or metal layers over the IMD layer 279. Example materials of the IMD layer 279 include, but are not limited to, SiNx, SiOx, SiON, SiC, SiBN, SiCBN, or combinations thereof.

Due to the formation of the gate contacts 252 and 254, the gate contact 252 and 254 may be disposed above the channel region and between the S/D contact, and thus it allows designer has more choices to dispose the gate contacts on sites, such as STI region and channel region of the semiconductor device, and thus the conductive lines can be design more freedom without layout constraint and the circuit density can be improved. Furthermore, the gate, S/D, butt contacts in line shape can help on lithography patterning and improve a critical dimension (CD) thereof. The gate contact barrier layers with high-K dielectric surrounding the gate contacts improve the isolation margin between the gate contacts and the adjacent S/D and/or butt contacts. Similarly, the S/D and/or butt contact barrier layers with high-K dielectric surrounding the S/D contacts improve the isolation margin between the S/D and/or butt contacts and the adjacent gate contacts.

In some embodiments, a semiconductor device includes a substrate, a semiconductor fin, first and second source/drains, a gate electrode, and a gate contact. The semiconductor fin is disposed on the substrate. The first and second source/drains is disposed on the semiconductor fin. The gate electrode is across the semiconductor fin and exposes the first and second source/drains. The gate contact is disposed on the gate electrode and with an elliptical profile having a major axis extending along a lengthwise direction of the gate electrode when viewed from above the gate contact.

In some embodiments, the gate contact overlaps the semiconductor fin.

In some embodiments, a length of the gate contact along the lengthwise direction of the gate electrode is greater than that a length along a lengthwise direction of the semiconductor fin.

In some embodiments, the major axis of the elliptical profile of the gate contact intersects with a lengthwise direction of the semiconductor fin.

In some embodiments, the semiconductor device further includes a barrier layer surrounding the gate contact.

In some embodiments, the barrier layer includes a high-k dielectric material.

In some embodiments, the semiconductor device further includes an interlayer dielectric (ILD) layer on the substrate. The gate contact is embedded in the ILD layer, and a dielectric constant of the ILD layer is less than a dielectric constant of the barrier layer.

In some embodiments, the semiconductor device further includes first and second S/D contacts respectively overlap the first and second source/drains. The gate contact is between the first and second S/D contacts.

In some embodiments, the semiconductor device further includes a S/D contact and a barrier layer. The S/D contact overlaps one of the first and second source/drains. The barrier layer surrounds the S/D contact.

In some embodiments, the barrier layer includes a high-k dielectric material.

In some embodiments, the semiconductor device further includes a conductive line electrically connected to the gate contact and overlapping the semiconductor fin.

In some embodiments, a semiconductor device includes a first semiconductor fin, first and second source/drains, a gate electrode, a gate contact, and a barrier layer. The first semiconductor fin is disposed on a substrate. The first and second source/drains is disposed on the semiconductor fin. The first gate electrode is across the first semiconductor fin. The gate contact is disposed on the gate electrode. The barrier layer surrounds the gate contact and is made of a high-k dielectric.

In some embodiments, the gate contact has an elliptical profile.

In some embodiments, the elliptical profile extends along a lengthwise direction of the gate electrode when viewed from above the gate contact.

In some embodiments, the high-k dielectric material comprises $HfO_2$, $Ta_2O_5$, $TiO_2$, $ZrO_2$, $Al_2O_3$, $Y_2O_3$, or combinations thereof.

In some embodiments, an entirety of the gate contact vertically overlaps the gate electrode.

In some embodiments, the semiconductor device further includes a second semiconductor fin on the substrate. The gate electrode is across the first and second semiconductor fins, and a portion of the gate contact is between the first and second semiconductor fins.

In some embodiments, a method for manufacturing a semiconductor device includes: modelling in a layout a fin structure; modelling in the layout a gate electrode crossing the fin structure; modelling in the layout a gate contact superimposed on the gate electrode and having a lengthwise direction parallel to a lengthwise direction of the gate electrode; and forming a physical gate electrode and a physical gate contact in an integrated circuit using the gate electrode and the gate contact as patterns.

In some embodiments, forming a barrier layer on the physical gate electrode prior to forming the physical gate contact.

In some embodiments, the barrier layer includes a high-k dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor fin on a substrate and extending in a y-direction;
   first and second source/drains on the semiconductor fin;
   a gate electrode across the semiconductor fin, extending in a x-direction transverse to the y-direction, and exposing the first and second source/drains; and
   a gate contact on the gate electrode, having an elliptical profile with a major axis extending along the x-direction, and having opposite longest sides extending past opposite longest sides of the semiconductor fin when viewed from above.

2. The semiconductor device of claim 1, wherein the gate contact overlaps the semiconductor fin.

3. The semiconductor device of claim 1, wherein a length of the gate contact along the x-direction of the gate electrode is greater than a length along a lengthwise direction of the semiconductor fin.

4. The semiconductor device of claim 1, wherein the major axis of the elliptical profile of the gate contact intersects with a lengthwise direction of the semiconductor fin.

5. The semiconductor device of claim 1, further comprising a barrier layer surrounding the gate contact.

6. The semiconductor device of claim 5, wherein the barrier layer comprises a high-k dielectric material.

7. The semiconductor device of claim 5, further comprising an interlayer dielectric (ILD) layer on the substrate, wherein the gate contact is embedded in the ILD layer, and a dielectric constant of the ILD layer is less than a dielectric constant of the barrier layer.

8. The semiconductor device of claim 1, further comprising first and second S/D contacts respectively overlapping the first and second source/drains, wherein the gate contact is between the first and second S/D contacts.

9. The semiconductor device of claim 1, further comprising:
   a S/D contact overlapping one of the first and second source/drains; and
   a barrier layer surrounding the S/D contact.

10. The semiconductor device of claim 9, wherein the barrier layer comprises a high-k dielectric material.

11. The semiconductor device of claim 1, further comprising a conductive line electrically connected to the gate contact and overlapping the semiconductor fin.

12. A semiconductor device, comprising:
    a first semiconductor fin on a substrate;
    first and second source/drains on the first semiconductor fin;
    a gate electrode across the first semiconductor fin;
    a gate contact disposed on the gate electrode, wherein the gate contact has an elliptical profile extending along a lengthwise direction of the gate electrode when viewed from above the gate contact; and
    a barrier layer surrounding the gate contact and made of a high-k dielectric material.

13. The semiconductor device of claim 12, wherein the high-k dielectric material comprises $HfO_2$, $Ta_2O_5$, $TiO_2$, $ZrO_2$, $Al_2O_3$, $Y_2O_3$, or combinations thereof.

14. The semiconductor device of claim 12, wherein an entirety of the gate contact vertically overlaps the gate electrode.

15. The semiconductor device of claim 12, further comprising a second semiconductor fin on the substrate, wherein the gate electrode is across the first and second semiconductor fins, and a portion of the gate contact is between the first and second semiconductor fins.

16. The semiconductor device of claim 12, wherein the gate contact extends past opposite longest sides of the first semiconductor fin when viewed from above.

17. The semiconductor device of claim 12, further comprising a gate via that lands on the gate contact, wherein the gate via is directly between the first and second source/drains when viewed from above.

18. A semiconductor device, comprising:
    a semiconductor fin on a substrate;
    a first source/drain and a second source/drain on the semiconductor fin;
    a gate electrode across a channel region of the semiconductor fin between the first source/drain and the second source/drain;
    a gate contact on the gate electrode having an elliptical profile when viewed from above and overlapping with the channel region of the semiconductor fin; and
    a metal line extending along a lengthwise direction of the semiconductor fin and overlapping the gate contact, wherein the gate contact has opposite longest sides extending past opposite longest sides of the metal line when viewed from above.

19. The semiconductor device of claim 18, further comprising first and second source/drain contacts that are directly above the first and second source/drains, wherein the gate contact is directly between the first and second source/drain contacts when viewed from above.

20. The semiconductor device of claim 18, further comprising a gate via that lands on the gate contact, wherein the gate via is directly between the first and second source/drains when viewed from above.

* * * * *